(12) United States Patent
Hasan et al.

(10) Patent No.: US 12,092,964 B2
(45) Date of Patent: Sep. 17, 2024

(54) OPTICALLY DETERMINING ELECTRICAL CONTACT BETWEEN METALLIC FEATURES IN DIFFERENT LAYERS IN A STRUCTURE

(71) Applicant: ASML NETHERLANDS B.V., Veldhoven (NL)

(72) Inventors: Shakeeb Bin Hasan, Eindhoven (NL); Benoit Herve Gaury, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 233 days.

(21) Appl. No.: 17/782,771

(22) PCT Filed: Nov. 20, 2020

(86) PCT No.: PCT/EP2020/082933
§ 371 (c)(1),
(2) Date: Jun. 6, 2022

(87) PCT Pub. No.: WO2021/121871
PCT Pub. Date: Jun. 24, 2021

(65) Prior Publication Data
US 2023/0009177 A1 Jan. 12, 2023

(30) Foreign Application Priority Data

Dec. 19, 2019 (EP) ..................................... 19218265
Oct. 7, 2020 (EP) ..................................... 20200638

(51) Int. Cl.
*G03F 7/00* (2006.01)
*G01B 11/14* (2006.01)
*G01N 21/552* (2014.01)

(52) U.S. Cl.
CPC .......... *G03F 7/70633* (2013.01); *G01B 11/14* (2013.01); *G01N 21/553* (2013.01); *G03F 7/70625* (2013.01)

(58) Field of Classification Search
CPC .... G01N 21/55; G01N 21/552; G01N 21/553; G01N 21/554; G01N 21/9501;
(Continued)

(56) References Cited

U.S. PATENT DOCUMENTS 6,046,792 A   4/2000   Van der Werf et al.
6,961,116 B2  11/2005  Den Boef et al.
(Continued)

FOREIGN PATENT DOCUMENTS

EP        1628164      2/2006
TW       200617372     6/2006
(Continued)

OTHER PUBLICATIONS

International Search Report and Written Opinion issued in corresponding PCT Patent Application No. PCT/EP2020/082933, dated Apr. 6, 2021.
(Continued)

*Primary Examiner* — Gordon J Stock, Jr.
(74) *Attorney, Agent, or Firm* — Pillsbury Winthrop Shaw Pittman, LLP

(57) ABSTRACT

Optically determining whether metallic features in different layers in a structure are in electrical contact with each other. When the metallic features include different metals and/or have different dimensions, which cause one or more resonances in reflected radiation to be detected, the metallic features in the different layers are determined to be in contact or out of contact with each other based on the spectral positions of the one or more resonances. When the metallic features are formed from the same metal and have (Continued)

the same dimensions, the metallic features in the different layers are determined to be in contact with each other responsive to detection of a single resonance associated with the metallic features and out of contact with each other responsive to detection of two or more resonances associated with the metallic features.

20 Claims, 14 Drawing Sheets

(58) Field of Classification Search
CPC ....... G01B 11/14; G01B 11/02; G01B 11/022; G01B 11/024; G01B 11/26; G01B 11/27; G01B 11/272; G03F 7/70605; G03F 7/70608; G03F 7/70616; G03F 7/70625; G03F 7/70633; G03F 7/70641; G03F 7/7065; G03F 7/70653; G03F 7/70658; G03F 7/70681; G03F 7/70683; G03F 7/706843; G03F 7/706847; G03F 7/706849; G03F 7/706851
See application file for complete search history.

(56) References Cited

U.S. PATENT DOCUMENTS

| | | | | |
|---|---|---|---|---|
| 8,879,073 B2* | 11/2014 | Madsen | ............. | G01B 11/0625 356/625 |
| 10,211,162 B2* | 2/2019 | Rademaker | ............... | G03F 1/84 |
| 10,510,675 B2* | 12/2019 | Ghosh | ................... | H01L 23/544 |
| 10,883,924 B2* | 1/2021 | O'Mullane | .......... | G01N 21/211 |
| 11,808,715 B2* | 11/2023 | Keller | ................. | G03F 7/70683 |
| 2004/0218185 A1 | 11/2004 | Yamada et al. | | |
| 2006/0066855 A1 | 3/2006 | Den Boef et al. | | |
| 2008/0285040 A1* | 11/2008 | Fourkas | ............... | G01N 21/554 324/702 |
| 2011/0027704 A1 | 2/2011 | Cramer et al. | | |
| 2011/0043791 A1 | 2/2011 | Smilde et al. | | |
| 2012/0242970 A1 | 9/2012 | Smilde et al. | | |
| 2013/0327928 A1* | 12/2013 | Leach | ..................... | H01L 31/04 156/280 |
| 2015/0233818 A1* | 8/2015 | Manassen | ............... | G01N 21/41 716/30 |
| 2016/0290796 A1* | 10/2016 | Levy | .................. | G03F 7/70525 |
| 2018/0233456 A1 | 8/2018 | Rademaker et al. | | |
| 2019/0244911 A1 | 8/2019 | Ghosh et al. | | |

FOREIGN PATENT DOCUMENTS

| | | |
|---|---|---|
| WO | 2009078708 | 6/2009 |
| WO | 2009106279 | 9/2009 |
| WO | 2015120070 | 8/2015 |
| WO | 2015191141 | 12/2015 |

OTHER PUBLICATIONS

Auguie, B. et al.: "Collective Resonances in Gold Nanoparticle Arrays", Phys. Rev. Lett. 101, 143902 (2008).

\* cited by examiner

OPTICALLY DETERMINING ELECTRICAL CONTACT BETWEEN METALLIC FEATURES IN DIFFERENT LAYERS IN A STRUCTURE

CROSS-REFERENCE TO RELATED APPLICATIONS

This application is a U.S. national phase entry of PCT Patent Application No. PCT/EP2020/082933 which was filed Nov. 20, 2020, which claims the benefit of priority of European Patent Application No. 19218265.7 which was filed on Dec. 19, 2019 and of European Patent Application No. 20200638.3 which was filed on Oct. 7, 2020 which are incorporated herein in their entireties by reference.

TECHNICAL FIELD

The description herein relates generally to optically determining electrical contact between (e.g., first and second) metallic features in different (e.g., first and second) layers in a structure.

BACKGROUND

A lithographic projection apparatus can be used, for example, in the manufacture of integrated circuits (ICs). A patterning device (e.g., a mask) may include or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate includes a plurality of adjacent target portions to which the pattern is transferred successively by the lithographic projection apparatus, one target portion at a time. In one type of lithographic projection apparatuses, the pattern on the entire patterning device is transferred onto one target portion in one operation. Such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

Prior to transferring the pattern from the patterning device to the substrate, the substrate may undergo various procedures, such as priming, resist coating, and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, deposition, chemo-mechanical polishing, etc., all intended to finish the individual layer of the device. If several layers are required in the device, then the whole procedure, or a variant thereof, is repeated for each layer. Eventually, a device will be present in each target portion on the substrate. These devices are then separated from one another by a technique such as dicing or sawing, such that the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, deposition, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, deposition, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the number of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but are not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET).

SUMMARY

According to an embodiment, there is provided a system configured to determine whether metallic features in different layers in a structure are in electrical contact with each other. The system comprises a radiation source configured to irradiate a target portion of the structure with radiation. The target portion comprises a first metallic feature in a first layer and a second metallic feature in a second layer of the structure. The system comprises one or more sensors configured to detect one or more resonances in reflected radiation from the first and second metallic features. The system comprises one or more processors operatively coupled to the radiation source and the one or more sensors. The one or more processors are configured to determine whether the first metallic feature in the first layer and the second metallic feature in the second layer are in electrical contact with each other based on (i) a number of detected resonances or (ii) spectral positions of detected resonances.

In an embodiment, the first and second metallic features in the first and second layers comprise different metals and/or have different dimensions, which cause one or more resonances in the reflected radiation to be detected by the one or more sensors, and the first and second metallic features in the first and second layers are determined, by the one or more processors, to be in electrical contact or out of electrical contact with each other based on the spectral positions of the one or more resonances. In an embodiment, the first and second metallic features in the first and second layers are formed from the same metal and have the same dimensions, and the one or more processors are configured such that the first and second metallic features in the first and second layers are determined to be in electrical contact with each other responsive to detection of a single resonance associated with the first and second metallic features and out of electrical contact with each other responsive to detection of two or more resonances associated with the first and second metallic features.

In an embodiment, the one or more resonances comprise plasmon resonances.

In an embodiment, the one or more resonances comprise predominantly dipolar (but may also include quadrupolar and/or magnetic dipolar) surface plasmon polariton resonances in the reflected radiation.

In an embodiment, the one or more sensors comprise one or more spectrometer detectors configured to detect intensity as a function of wavelength of the reflected radiation.

In an embodiment, the one or more sensors are configured as a normal-incidence inspection apparatus where the one or more sensors are oriented at an angle normal to the target portion, or as an oblique-incidence inspection apparatus where the one or more sensors are oriented at a non-normal angle to the target portion.

In an embodiment, the radiation source is configured such that the radiation comprises broadband white light collimated with a lens system and transmitted through an interference filter and a polarizer.

In an embodiment, the first and second metallic features comprise different portions of a via that extends through the first and second layers.

In an embodiment, an individual resonance comprises a maximum in a wavelength spectrum of the reflected radiation.

In an embodiment, the first and second metallic features in the first and second layers of the structure are arranged in an array. The array has a pitch. Detecting the one or more resonances in the reflected radiation from the first and second metallic features comprises detecting a resonance associated with the pitch with the one or more sensors.

In an embodiment, the resonance associated with the pitch is a Fano resonance.

In an embodiment, the resonance associated with the pitch has a resonance shape. The determination of whether the first and second metallic features are in electrical contact is based on the resonance shape.

In an embodiment, the one or more processors are further configured to facilitate adjusting the pitch of the array based on the resonance associated with the pitch.

In an embodiment, the one or more processors are further configured to determine one or more of overlay, a manufacturing process failure rate, a critical dimension, or a critical dimension variance associated with the target portion of the structure based on the detected one or more resonances.

According to another embodiment, there is provided a method for determining whether metallic features in different layers in a structure are in electrical contact with each other. The method comprises irradiating, with a radiation source, a target portion of the structure with radiation. The target portion comprises a first metallic feature in a first layer and a second metallic feature in a second layer of the structure. The method comprises detecting, with one or more sensors, one or more resonances in reflected radiation from the first and second metallic features. The method comprises determining, with one or more processors, whether the first and second metallic features in the first and second layers are in electrical contact with each other based on the detected one or more resonances. In an embodiment, the first and second metallic features in the first and second layers comprise different metals and/or have different dimensions, which cause at least two different resonances in the reflected radiation to be detected by the one or more sensors, and the first and second metallic features in the first and second layers are determined, by the one or more processors, to be in electrical contact or out of electrical contact with each other based on spectral positions of detected resonances. In an embodiment, the first and second metallic features in the first and second layers are formed from the same metal and have the same dimensions, and the one or more processors are configured such that the first and second metallic features in the first and second layers are determined to be in electrical contact with each other responsive to detection of a single resonance associated with the first and second metallic features and out of electrical contact with each other responsive to detection of two or more resonances associated with the first and second metallic features.

According to another embodiment, there is provided a method for determining an adjustment for a semiconductor device manufacturing apparatus. The method comprises irradiating a target portion of a semiconductor device with radiation. The target portion comprises a first metallic feature in a first layer and a second metallic feature in a second layer of the semiconductor device. The method comprises detecting one or more resonances in reflected radiation from the first and second metallic features. The method comprises determining relative positions of the first and second layers based on the detected one or more resonances. The method comprises determining whether the first and second metallic features in the first and second layers are in electrical contact with each other based on the detected one or more resonances. In an embodiment, the first and second metallic features in the first and second layers comprise different metals and/or have different dimensions, which cause one or more resonances in the reflected radiation to be detected by the one or more sensors, and the first and second metallic features in the first and second layers are determined, by the one or more processors, to be in electrical contact or out of electrical contact with each other based on spectral positions of the one or more resonances. In an embodiment, the first and second metallic features in the first and second layers are formed from the same metal and have the same dimensions, and the first and second metallic features in the first and second layers are determined to be in electrical contact with each other responsive to detection of a single resonance associated with the first and second metallic features and out of electrical contact with each other responsive to detection of two or more resonances associated with the first and second metallic features. The method comprises determining one or more semiconductor device manufacturing process parameters based on the relative positions of the different layers and/or the determination of whether the first and second metallic features are in electrical contact with each other. The method comprises determining the adjustment for the semiconductor device manufacturing apparatus based on the one or more determined semiconductor device manufacturing process parameters.

According to another embodiment, a method for determining relative positions of different layers in a structure is described. The method comprises irradiating a target portion of the structure with radiation. The target portion comprises metallic features in the different layers of the structure. The method comprises detecting one or more resonances in reflected radiation from the metallic features; and determining the relative positions of the different layers based on the detected one or more resonances.

In an embodiment, the radiation comprises light.

In an embodiment, determining the relative positions of the different layers comprises determining a relative shift between the different layers. In an embodiment, determining the relative positions of the different layers comprises determining overlay associated with the different layers.

In an embodiment, the method further comprises determining whether the metallic features in the different layers are in contact with each other based on the detected one or more resonances.

In an embodiment, the metallic features in the different layers comprise different metals and/or have different dimensions, which cause at least two different resonances in the reflected radiation to be detected.

In an embodiment, the metallic features in the different layers are determined to be in contact or out of contact with each other based on a distance between the at least two different resonances.

In an embodiment, a distance between the at least two different resonances corresponds to an amount the different layers are shifted relative to each other.

In an embodiment, the metallic features in the different layers are formed from the same metal and have the same dimensions, and are determined to be in contact with each other responsive to detection of a single resonance associated with the metallic features.

In an embodiment, the metallic features in the different layers are formed from the same metal and have the same dimensions, and are determined to be out of contact with each other responsive to detection of two or more resonances associated with the metallic features.

In an embodiment, a distance between resonances corresponds to an amount the different layers are shifted relative to each other.

In an embodiment, the different layers comprise two layers, each layer having at least one metallic feature.

In an embodiment, the metallic features comprise different portions of a via that extends through the different layers.

In an embodiment, the one or more resonances comprise plasmon resonances.

In an embodiment, an individual resonance comprises a maximum in a wavelength spectrum of the reflected radiation.

In an embodiment, the metallic features in the different layers of the structure are arranged in an array. The array may have a pitch. Detecting the one or more resonances in the reflected radiation from the metallic features comprises detecting a resonance associated with the pitch.

In an embodiment, the resonance associated with the pitch is a Fano resonance.

In an embodiment, the resonance associated with the pitch has a resonance shape. The relative positions of the different layers are determined based on the resonance shape. Put another way, the resonance associated with the pitch leads to an asymmetric line shape. The relative positions of the different layers are determined by characterizing the asymmetry of this line shape.

In an embodiment, determining the relative positions of the different layers comprises determining overlay associated with the different layers based on the resonance associated with the pitch.

In an embodiment, the method further comprises adjusting the pitch of the array based on the resonance associated with the pitch.

In an embodiment, the structure comprises at least a portion of a semiconductor device.

In an embodiment, determining the relative positions of the different layers based on the detected one or more resonances is performed as part of a semiconductor device manufacturing process.

In an embodiment, the method further comprises adjusting the semiconductor device manufacturing process or a design of a semiconductor device based on the relative positions of the different layers.

According to another embodiment, a method for determining an adjustment for a semiconductor device manufacturing apparatus is provided. The method comprises irradiating a target portion of a semiconductor device with radiation. The target portion comprises metallic features in different layers of the semiconductor device. The method comprises detecting one or more resonances in reflected radiation from the metallic features; determining relative positions of the different layers based on the detected one or more resonances; determining one or more semiconductor device manufacturing process parameters based on the relative positions of the different layers; and determining the adjustment for the semiconductor device manufacturing apparatus based on the one or more determined semiconductor device manufacturing process parameters.

In an embodiment, the radiation comprises light.

In an embodiment, determining the relative positions of the different layers comprises determining overlay as part of a semiconductor device manufacturing process.

In an embodiment, the one or more determined semiconductor device manufacturing process parameters comprise one or more of a mask design, a metrology target design, a semiconductor device design, an intensity of the radiation, an incident angle of the radiation, a wavelength of the radiation, a pupil size and/or shape, or a resist material.

In an embodiment, the method further comprises adjusting the semiconductor device manufacturing apparatus based on the determined adjustment.

According to another embodiment, a computer program product is provided. The computer program product comprises a non-transitory computer readable medium having instructions recorded thereon, the instructions when executed by a computer implementing any and/or all of the method(s) described above.

According to another embodiment, a system configured to determine relative positions of different layers in a structure is provided. The system comprises a radiation source configured to irradiate a target portion of the structure with radiation. The target portion comprises metallic features in the different layers of the structure. The system comprises one or more sensors configured to detect one or more resonances in reflected radiation from the metallic features; and one or more processors configured to determine the relative positions of the different layers based on the detected one or more resonances.

In an embodiment, the radiation comprises light.

In an embodiment, determining the relative positions of the different layers comprises determining a relative shift between the different layers.

In an embodiment, determining the relative positions of the different layers comprises determining overlay associated with the different layers.

In an embodiment, the one or more processors are further configured to determine whether the metallic features in the different layers are in contact with each other based on the detected one or more resonances.

In an embodiment, the metallic features in the different layers comprise different metals and/or have different dimensions, which cause at least two different resonances in the reflected radiation to be detected by the one or more sensors.

In an embodiment, the metallic features in the different layers are determined, by the one or more processors, to be in contact or out of contact with each other based on a distance between the at least two different resonances.

In an embodiment, the one or more processors are configured such that a distance between the at least two different resonances corresponds to an amount the different layers are shifted relative to each other.

In an embodiment, the one or more processors are configured such that the metallic features in the different layers are formed from the same metal and have the same dimensions, and are determined to be in contact with each other responsive to detection of a single resonance associated with the metallic features.

In an embodiment, the one or more processors are configured such that the metallic features in the different layers are formed from the same metal and have the same dimensions, and are determined to be out of contact with each other responsive to detection of two or more resonances associated with the metallic features.

In an embodiment, a distance between resonances corresponds to an amount the different layers are shifted relative to each other.

In an embodiment, the different layers comprise two layers, each layer having at least one metallic feature.

In an embodiment, the metallic features comprise different portions of a via that extends through the different layers.

In an embodiment, the one or more resonances comprise plasmon resonances.

In an embodiment, an individual resonance comprises a maximum in a wavelength spectrum of the reflected radiation.

In an embodiment, the metallic features in the different layers of the structure are arranged in an array. The array may have a pitch. Detecting the one or more resonances in the reflected radiation from the metallic features comprises detecting a resonance associated with the pitch with the one or more sensors.

In an embodiment, the resonance associated with the pitch is a Fano resonance.

In an embodiment, the resonance associated with the pitch has a resonance shape. The relative positions of the different layers are determined, by the one or more processors, based on the resonance shape. Put another way, the resonance associated with the pitch leads to an asymmetric line shape. The relative positions of the different layers are determined by characterizing the asymmetry of this line shape.

In an embodiment, the one or more processors are configured such that determining the relative positions of the different layers comprises determining overlay associated with the different layers based on the resonance associated with the pitch.

In an embodiment, the one or more processors are further configured to facilitate adjusting the pitch of the array based on the resonance associated with the pitch.

In an embodiment, the structure comprises at least a portion of a semiconductor device.

In an embodiment, the one or more processors are configured such that determining the relative positions of the different layers based on the detected one or more resonances is performed as part of a semiconductor device manufacturing process. In an embodiment, the one or more processors are further configured to facilitate adjustment of the semiconductor device manufacturing process or a design of a semiconductor device based on the relative positions of the different layers.

BRIEF DESCRIPTION OF THE DRAWINGS

The above aspects and other aspects and features will become apparent to those ordinarily skilled in the art upon review of the following description of specific embodiments in conjunction with the accompanying figures.

DETAILED DESCRIPTION

Voltage contrast (VC) is a commonly used defect inspection method. Its application to metrology may require dedicated monitoring marks and the use of a scanning electron microscope for inspection. Voltage contrast monitoring marks are created by forming overlapping metallic patterns on two (or more) different layers of the in process semiconductor device. The bottom most layer must have an electrical connection to a wafer substrate (e.g., a connection to ground) for the voltage contrast method to function properly. Depending on the semiconductor device manufacturing process, the metallic pattern in a top or other upper layer above the bottom most layer may or may not have an electrical connection to the bottom most layer (e.g., a connection to ground), which shows as bright (connected to ground) or dark (not connected to ground) voltage contrast spots upon scanning electron microscope imaging. The bright and dark spots provide an indication whether one layer is electrically connected with another layer. Upon averaging ensembles of marks, a yield curve may be constructed.

Voltage contrast is a scanning electron microscope based technique, and is usually far slower than an optical measurement. While various metrics may be determined using voltage contrast, a semiconductor device manufacturing operation process window determined based on voltage contrast measurements is often not accurate because voltage contrast is only sensitive to a very high resistance of the path to ground between the layers of the voltage contrast overlay monitoring marks.

Defects may also be found with optical inspection techniques. As one example in semiconductor device manufacturing, optical overlay detection (e.g., determining the relative positions of features in different layers of a semiconductor device) is presently performed with different optical methods. For example, it may be performed by comparing higher diffraction orders of reflected radiation for structures where the pitch of the structure is larger than the wavelength of the radiation. This diffraction based optical detection of overlay is often restricted in its application to cases where the pitch of the structure is smaller than wavelength of the radiation. Detecting higher diffraction orders brings technical challenges, which further restricts the allowable pitch to wavelength ratio. As another example, in inclined illumination, the asymmetry in reflected light for different illumination directions is also used to infer the underlying overlay for dielectric (and possibly metallic) gratings, potentially even with subwavelength pitch.

Figure 1:
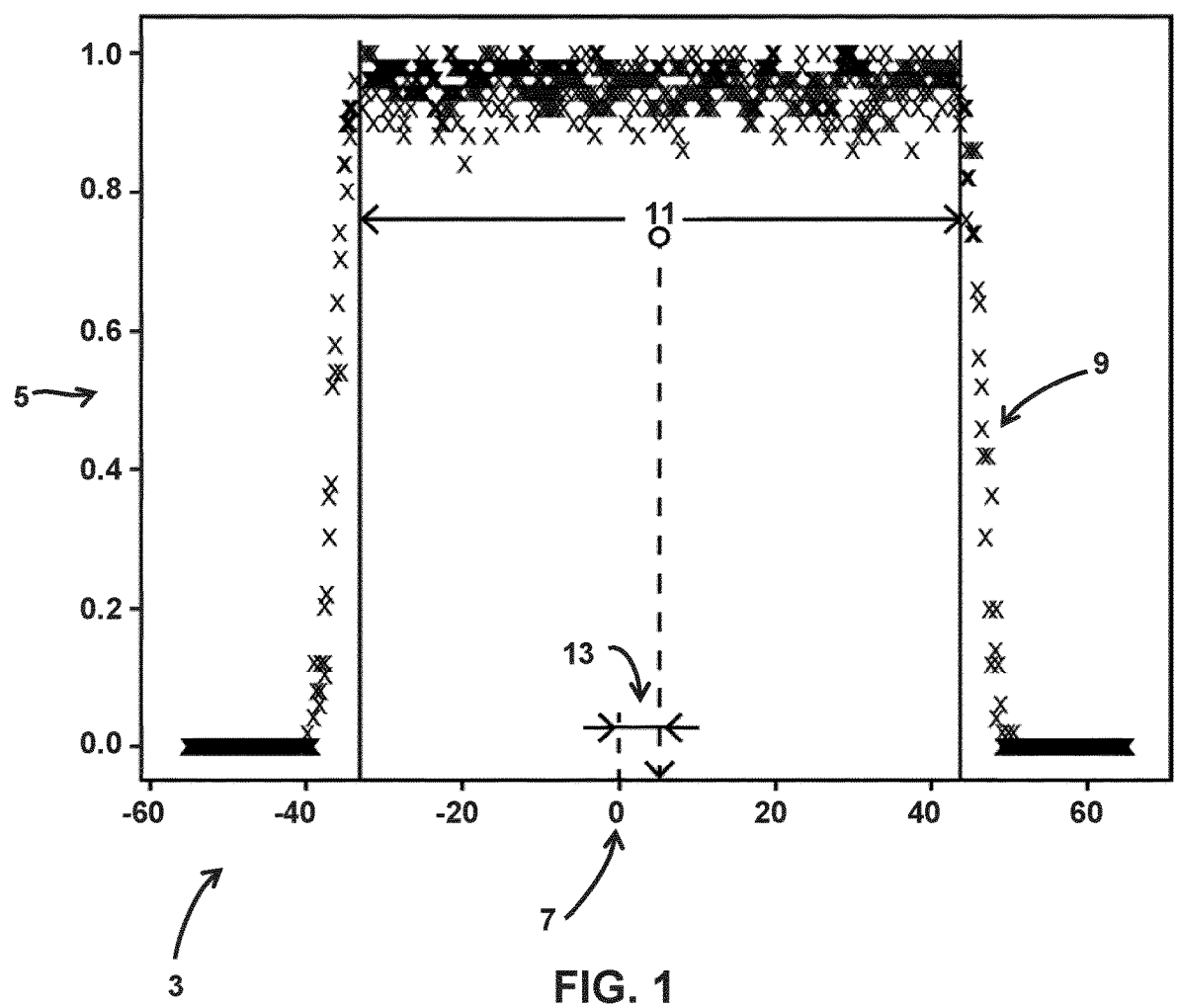
FIG. 1 illustrates an example of a yield versus overlay curve, according to an embodiment.

By way of a non-limiting example, FIG. 1 illustrates an example of a yield 5 versus overlay 7 curve 3. Yield 5 is an indication of process yield. Overlay 7 may have units of nanometers, for example. Marks 9 may be used to determine an overlay margin 11 and/or an overlay estimate 13 as shown. By way of a non-limiting example, one may 1) fit the data with a logistic curve, 2) get the yield value of the plateau, 3) find the programmed overlays that correspond to the endpoints of the plateau at 99% of the plateau value (vertical lines on FIG. 1), where 4) the overlay estimate (13) is the sum of these two programmed overlay values, while the overlay margin is the absolute value of the difference.

Advantageously, metallic features (e.g., first and second metallic features) in layers (e.g., first and second layers) of a semiconductor device, when irradiated with radiation from normal radiation sources used for optical inspection (which is a faster and easier to use method than voltage contrast and the scanning electron microscope) produce resonant effects that can be leveraged as an alternative approach to typical optical or voltage contrast methods. (For clarification, optical does not necessarily mean the optical part of the electromagnetic spectrum. It may also include infra-red or even THz. In this document, optical measurement may loosely refer to 'electromagnetic wave' measurement as opposed to measurement using electrons.) Present methods (e.g., voltage contrast and current optical measurement methods) do not utilize the effects described above. The present systems and methods may be used to inspect structures also at subwavelength pitch which diffraction based optical methods cannot. This means that the present systems and methods can be used to perform measurements directly on semiconductor device features, without the need for special marks. In addition, the present systems and methods rely on linear optical effects, which are repeatable (e.g., unlike voltage contrast methods). For comparison, with voltage contrast, different measurements of the same features at times show different results, complicating the interpretation of measured data. VC measurements of the same features at different times sometimes show different results because of things like unstable charging conditions, surface contamination, or other unknown reasons. VC measurements may also cause potential sample damage. Electrons tend to be destructive to a sample and it is a concern to keep doses low enough to keep the damage to an acceptable minimum while providing acceptable measurements. Optical measurement techniques do not have these and other disadvantages.

Metallic features exhibit plasmon resonances that are sensitive to the geometry and/or relative locations of the metallic features. These resonances can be used to determine whether there is electrical contact between metallic features in different layers of a semiconductor device. Resonance(s) can be detected in the radiation reflected from the layers of the semiconductor device (e.g., the reflected signal or spectrum used for a measurement) irrespective of the diffraction order. Measuring at a specific diffraction order poses additional hardware challenges as to the incident illumination direction (which determines the angle of reflection orders) and the detector assembly that has to collect diffracted light belonging to specific diffraction order. An approach that has nothing to do with a particular diffraction order generally makes it easier to locate a detector apparatus. The present approach does not depend upon diffraction order because it senses the metrological parameters by looking at the frequency spectrum.

The resonance(s) in the reflected radiation depend on the extent of contact due to the sensitivity of surface plasmon resonances on the geometry (e.g., relative shift and contact between metal features in different layers of a semiconductor device structure). For example, if two metallic features in different layers of a structure are in physical (e.g., electrical) contact, there may be one resonance each corresponding to the two features (indicated by two maxima in the wavelength spectrum) in the reflected radiation. If the two metallic features have lost contact, this will again impact the resonance wavelength due to radical change in geometry after losing contact. In special cases when the two layers in isolation have resonances at the same wavelength, separation between the two resonances (maxima), the locations of the resonances (maxima) in the wavelength spectrum, the relative intensities of the resonances (e.g., the heights of the peaks that indicate the maxima), and/or other information in the reflected signal may be used to determine various metrics.

For example, if first and second metallic features in first and second layers comprise different metals and/or have different dimensions, at least two different resonances in reflected radiation may be detected. (Whether two resonances are actually detected depends upon the bandwidth of detector, and/or other factors. Likewise, sometimes the materials can have such high absorption that only predominantly dipolar resonances remain visible.) The metallic features in the different layers are determined to be in contact or out of contact with each other based on the spectral positions of the (e.g., one or more) resonances, a distance between at least two different resonances, and or other information. If the first and second metallic features in the first and second layers are formed from the same metal and have the same dimensions, a single resonance associated with the metallic features is detected if the metallic features are in contact with each other, and two (or more) resonances may be detected if the metallic features are not in contact with each other. This is further described below.

In some embodiments, in combination with and/or instead of the plasmon resonances described above, a resonance associated with a pitch of an array of metallic features may be used to determine alignment, as described herein.

The description herein relates generally to mask manufacturing and patterning processes. More particularly, the following paragraphs describe several components of a system and/or related systems, as well as methods for determining relative positions of layers in a structure. As described, these systems and methods may be used for overlay and/or other measurement in a semiconductor device manufacturing process, for example, or during other operations.

Although specific reference may be made in this text to the manufacture of integrated circuits (ICs) for semiconductor devices, it should be understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

Figure 2:
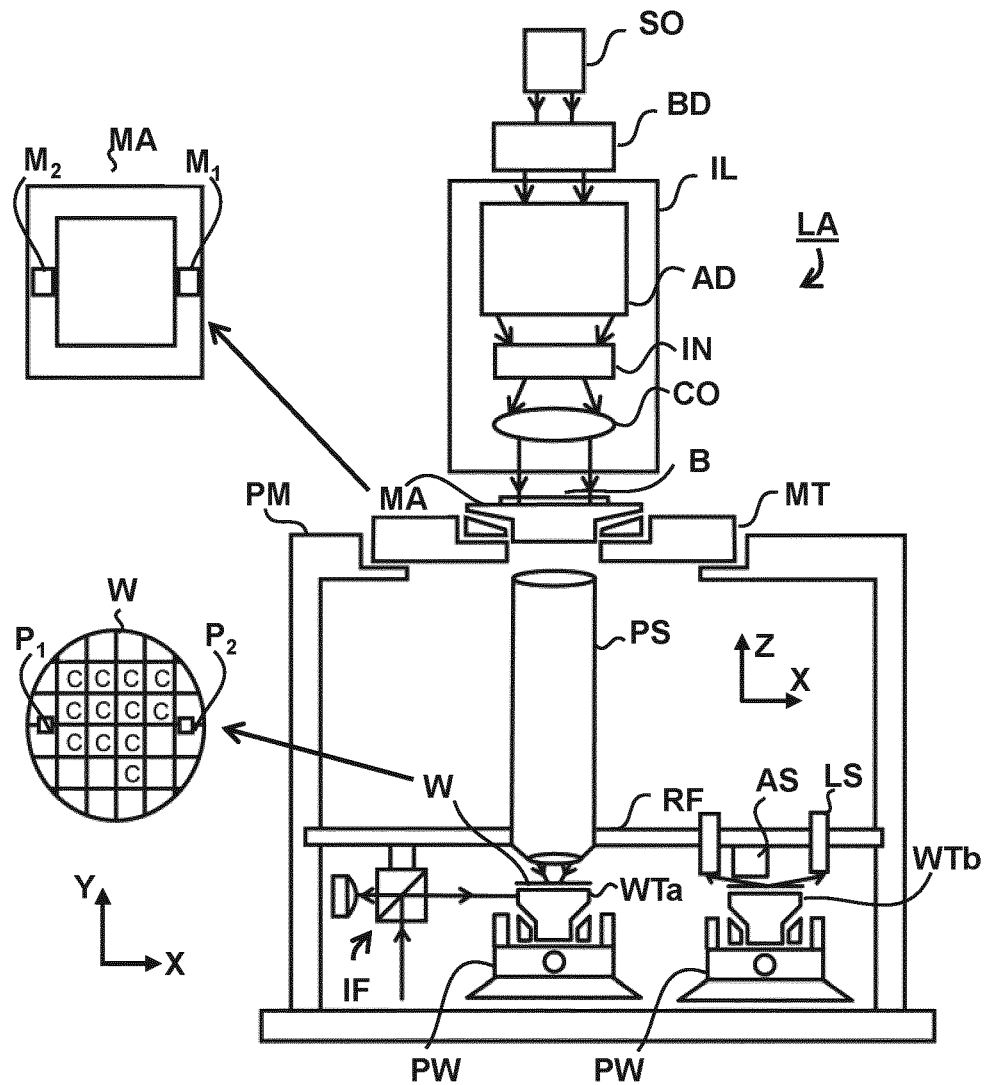
FIG. 2 schematically depicts a lithography apparatus, according to an embodiment.

By way of an introduction, FIG. 2 schematically depicts an embodiment of a lithographic apparatus LA. The apparatus comprises an illumination system (illuminator) IL configured to condition a radiation beam B (e.g. UV radiation, DUV radiation, or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT (e.g., WTa, WTb or both) configured to hold a substrate (e.g. a resist-coated wafer) W and coupled to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies and often referred to as fields) of the substrate W. The projection system is supported on a reference frame (RF).

As depicted, the apparatus is of a transmissive type (e.g. employing a transmissive mask). Alternatively, the apparatus may be of a reflective type (e.g. employing a programmable mirror array of a type as referred to above, or employing a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases, the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjuster AD configured to adjust the (angular/spatial) intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable to alter the polarization of the beam and may be operable to adjust the polarization using adjuster AD. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode, the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic or other types of optical components, or any combination thereof, for directing, shaping, or controlling radiation.

Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure may use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in a target portion of the device, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element.

Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines, the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

In operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. to position different target portions C in the path of the radiation beam B. Similarly, the first positioner PM and another position sensor (which is not explicitly depicted in FIG. 2) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus may be used in at least one of the following modes. In step mode, the support structure MT and the substrate table WT are kept essentially stationary, while a pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed, and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already includes multiple processed layers.

The terms "radiation" and "beam" used herein encompass all types of electromagnetic radiation, including ultraviolet (UV) or deep ultraviolet (DUV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

Various patterns on or provided by a patterning device may have different process windows. i.e., a space of processing variables under which a pattern will be produced within specification. Examples of pattern specifications that relate to potential systematic defects include checks for necking, line pull back, line thinning, CD, edge placement, overlapping, resist top loss, resist undercut and/or bridging. The process window of the patterns on a patterning device or an area thereof may be obtained by merging (e.g., overlapping) process windows of each individual pattern. The boundary of the process window of a group of patterns comprises boundaries of process windows of some of the individual patterns. In other words, these individual patterns limit the process window of the group of patterns. These patterns can be referred to as "hot spots" or "process window limiting patterns (PWLPs)," which are used interchangeably herein. When controlling a part of a patterning process, it is possible and economical to focus on the hot spots. When the hot spots are not defective, it is most likely that other patterns are not defective.

Figure 3:
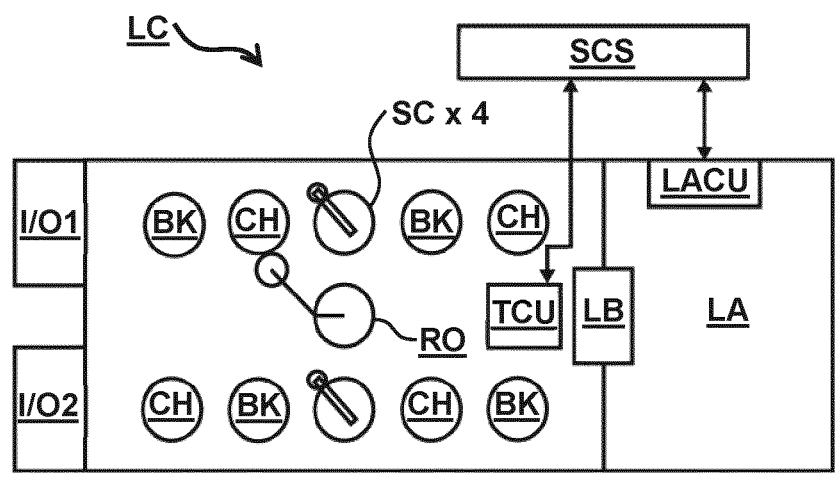
FIG. 3 schematically depicts an embodiment of a lithographic cell or cluster, according to an embodiment.

As shown in FIG. 3, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently and/or in order to monitor a part of the patterning process (e.g., a device manufacturing process) that includes at least one pattern transfer step (e.g., an optical lithography step), it is desirable to inspect a substrate or other object to measure or determine one or more properties such as alignment, overlay (which can be, for example, between structures in overlying layers or between structures in a same layer that have been provided separately to the layer by, for example, a double patterning process), line thickness, critical dimension (CD), focus offset, a material property, etc. Accordingly, a manufacturing facility in which lithocell LC is located also typically includes a metrology system that measures some or all of the substrates W (FIG. 2) that have been processed in the lithocell or other objects in the lithocell. The metrology system may be part of the lithocell LC, for example it may be part of the lithographic apparatus LA (such as alignment sensor AS (FIG. 2)).

The one or more measured parameters may include, for example, alignment, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on the substrate. The measurement can be performed after-development of a resist but before etching, after-etching, after deposition, and/or at other times.

There are various techniques for making measurements of the structures formed in the patterning process, including the use of a scanning electron microscope, an image-based measurement tool and/or various specialized tools. As discussed above, a fast and non-invasive form of specialized metrology tool is one in which a beam of radiation is directed onto a target on the surface of the substrate and properties of the scattered (diffracted/reflected) beam are measured. By evaluating one or more properties of the radiation scattered by the substrate, one or more properties of the substrate can be determined. Traditionally, this may be termed diffraction-based metrology. One such application of this diffraction-based metrology is in the measurement of overlay between layers of a target. Other applications are also known. For example, asymmetry can be measured by comparing opposite parts of the diffraction spectrum (for example, comparing the −1st and +1$^{st}$ orders in the diffraction spectrum of a periodic grating). This can be done as described above and as described, for example, in U.S. patent application publication US 2006-066855, which is incorporated herein in its entirety by reference. The present systems and methods describe an alternative overlay measurement technique.

Thus, in a device fabrication process (e.g., a patterning process or a lithography process), a substrate or other objects may be subjected to various types of measurement during or after the process. The measurement may determine whether a particular substrate is defective, may establish adjustments to the process and apparatuses used in the process (e.g., aligning two layers on the substrate or aligning the patterning device to the substrate), may measure the performance of the process and the apparatuses, or may be for other purposes. Examples of measurement include optical imaging (e.g., optical microscope), non-imaging optical measurement (e.g., measurement based on diffraction such as the ASML YieldStar metrology tool, the ASML SMASH metrology system), mechanical measurement (e.g., profiling using a stylus, atomic force microscopy (AFM)), and/or non-optical imaging (e.g., scanning electron microscopy (SEM)). The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which meet specifications. Other manufacturing process adjustments are contemplated.

A metrology system may be used to determine one or more properties of the substrate structure, and in particular, how one or more properties of different substrate structures vary, or different layers of the same substrate structure vary from layer to layer. The metrology system may be integrated into the lithographic apparatus LA or the lithocell LC, or may be a stand-alone device.

To enable the metrology, often one or more targets are specifically provided on the substrate. In an embodiment, the target is specially designed and may comprise a periodic structure. In an embodiment, the target is a part of a device pattern, e.g., a periodic structure of the device pattern. In an embodiment, the target on a substrate may comprise one or more 1-D periodic structures (e.g., gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars, or vias may alternatively be etched into the substrate (e.g., into one or more layers on the substrate).

However, in some embodiments, as described below, specific targets are not required for metrology. Instead, metrology may be conducted on metallic structures (e.g., as described) and/or other features of an actual device. For example, instead of including an additional, separately designed metrology mark (or marks) in a given pattern, the present systems and methods may utilize metallic features of an actual device for overlay and/or other metrology. This may reduce and/or eliminate time and effort spent on designing and fabricated specialized metrology marks and/or have other advantages.

In some embodiments, one of the parameters of interest of a patterning process is overlay, as described herein. Traditional overlay can be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by device product structures on a substrate. In an embodiment, multiple targets can be measured in one radiation capture.

As described above, in contrast with traditional overlay measurement techniques, the present systems and methods take advantage of how metallic features in layers of a semiconductor device, when irradiated with radiation from normal radiation sources used in optical overlay detection (which is a faster and easier to use method than voltage contrast and the scanning electron microscope) produce resonant effects that can be leveraged as an alternative approach to overlay detection. For overlay, these resonances can be used to determine whether there is contact between metallic features in different layers of a semiconductor device. For example, if metallic features in different layers comprise different metals and/or have different dimensions, at least two different resonances (indicated by maximums in the wavelength spectrum) in reflected radiation may be detected. The metallic features in the different layers are determined to be in contact or out of contact with each other based on a distance between the at least two different resonances (maxima). If the metallic features in the different layers are formed from the same metal and have the same dimensions, a single resonance (maximum) associated with the metallic features is detected if the metallic features are in contact with each other, and two (or more) resonances (maxima) may be detected if the metallic features are not in contact with each other. Separation between the two resonances (maxima), locations of the resonances (maxima) in the wavelength spectrum, the relative intensities of the resonances (e.g., the heights of the peaks that indicate the maxima) in the reflected signal, and/or other information may be used to determine an amount of overlay.

Figure 4:
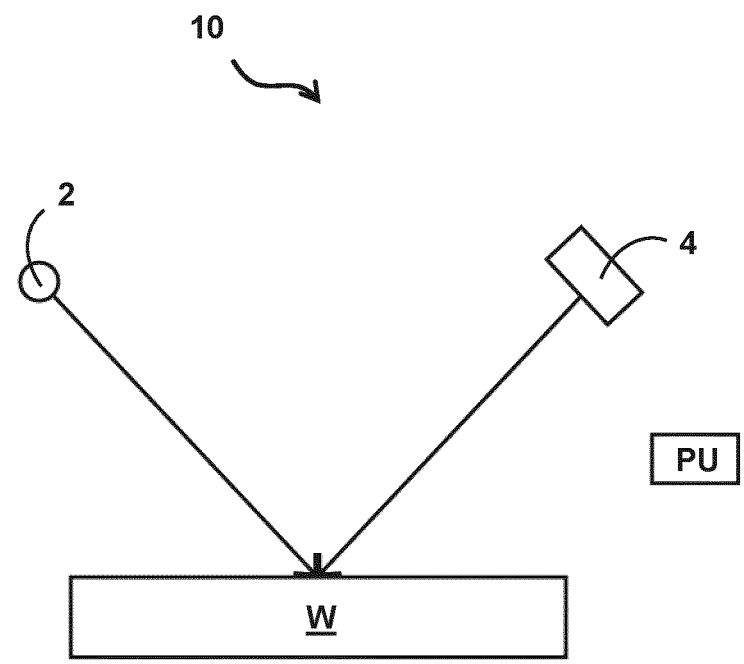
FIG. 4 schematically depicts an example inspection system and metrology technique, according to an embodiment.
Figure 4:
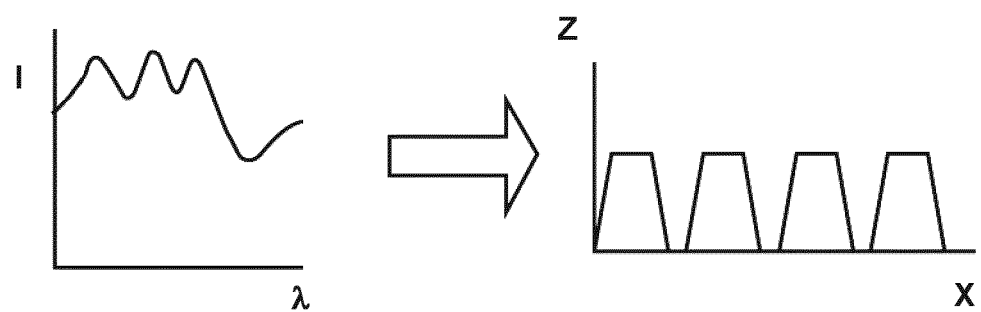

FIG. 4 depicts an example inspection system (e.g., a scatterometer) 10 that may be used to detect overlay and/or perform other metrology operations. It comprises a broadband (white light) radiation source projector 2 which projects or otherwise irradiates radiation onto a substrate W. The redirected radiation is passed to a sensor such as a spectrometer detector 4 and/or other sensors, which measures a spectrum (intensity as a function of wavelength) of the specular reflected radiation, as shown, e.g., in the graph in the lower left of FIG. 4. From this data, the structure or profile giving rise to the detected spectrum may be reconstructed by one or more processors PU, e.g. by Rigorous Coupled Wave Analysis and non-linear regression, by comparison with a library of simulated spectra as shown at the bottom right of FIG. 4, or by other operations. Such an inspection system may be configured as a normal-incidence inspection apparatus, an oblique-incidence inspection apparatus, and/or have other configurations.

Figure 5:
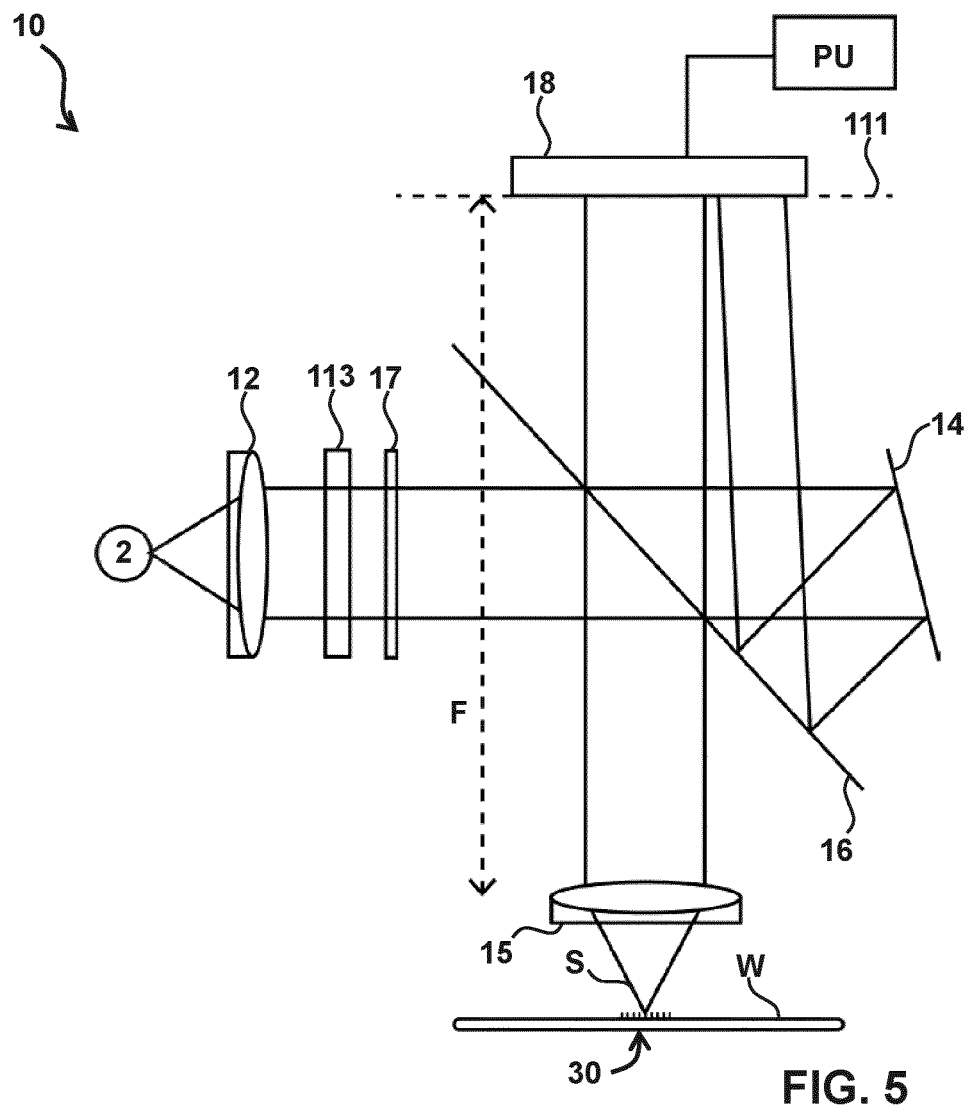
FIG. 5 schematically depicts an example inspection system, according to an embodiment.

Another example inspection system that may be used is shown in FIG. 5. The system shown in FIG. 5 may be a more detailed view of system 10 shown in FIG. 4, for example. In some embodiments, the radiation emitted by radiation source projector 2 is collimated using lens system 12 and transmitted through interference filter 113 and polarizer 17, reflected by partially reflecting surface 16 and is focused into a spot S on substrate W via an objective lens 15, which has a high numerical aperture (NA) (e.g., at least 0.9). An immersion inspection version of system 10 may also be used (using a relatively high refractive index fluid such as water) and may have a numerical aperture over 1.

As in the lithographic apparatus LA in FIG. 2, one or more substrate tables (not shown in FIG. 5) may be provided to hold the substrate W during measurement operations. The one or more substrate tables may be similar or identical in form to the substrate table WT of FIG. 2. In an example where inspection system 10 is integrated with the lithographic apparatus, they may even be the same substrate table. Coarse and fine positioners may be provided and configured to accurately position the substrate in relation to a measurement optical system. Various sensors and actuators are provided, for example, to acquire the position of a target portion of interest of a structure, and to bring it into position under the objective lens 15. Typically, many measurements will be made on target portions of a structure at different locations across the substrate W. The substrate support can be moved in X and Y directions to acquire different targets, and in the Z direction to obtain a desired location of the target portion relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and the substrate moves. Provided the relative position of the substrate and the optical system is correct, it does not matter in principle which one of those is moving in the real world, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

The radiation reflected and/or otherwise redirected by the substrate W then passes through partially reflecting surface 16 into a sensor such as detector 18 (similar to and/or the same as detector 4 shown in FIG. 4) in order to have the spectrum detected. Detector 18 may be located at a back-projected focal plane 111 (i.e., at the focal length F of the objective lens 15) or the plane 111 may be re-imaged with auxiliary optics (not shown) onto the detector 18. Detector 18 may be a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam may be used, for example, to measure the intensity of the incident radiation. For example, when the radiation beam is incident on the partially reflecting surface 16 part of it is transmitted through the partially reflecting surface 16 as a reference beam towards a reference mirror 14. The reference beam is then projected onto a different part of the same detector 18 or alternatively on to a different detector (not shown).

One or more interference filters 113 may be used to select a wavelength of interest in the range of, for example, 400-800 nm, 200-400 nm, 10-200 nm, and/or other ranges (e.g., depending on the metal used for the metal feature and/or other factors). An interference filter 113 may be tunable rather than comprising a set of different filters. In some embodiments, a grating may be used instead of an interference filter. In some embodiments, an aperture stop or spatial light modulator (not shown) may be provided in the illumination path to control the range of angle of incidence of radiation on the target.

Detector 18 may measure the intensity of redirected radiation at a single wavelength (or narrow wavelength range), the intensity separately at multiple wavelengths, or integrated over a wavelength range. Furthermore, detector 18 may separately measure the intensity of transverse magnetic- and transverse electric-polarized radiation and/or the phase difference between the transverse magnetic- and transverse electric-polarized radiation. Detector 18 may include a CCD device that records the incident intensity that is spatially averaged to obtain a scalar value of the reflected intensity for evaluation and/or other components.

For typical overlay measurements, the target (portion) 30 on substrate W may be a 1-D grating, which is printed such that after development, the bars are formed of solid resist lines (e.g., which may be covered by a deposition layer), and/or other materials. Or, the target 30 may be a 2-D grating, which is printed such that after development, the grating is formed of solid resist pillars, and/or other features in the resist. However, advantageously, with the present systems and methods, target (portion) 30 may include a target portion of the structure of substrate W comprising metallic features in different layers of the structure and/or other target portions. The target portion (e.g., target 30) may be formed by any portion of a pattern that includes such layers and metallic features. In other words, target 30 need not be limited to a specific overlay target. In some embodiments, the different layers of target (portion) 30 comprise two layers, each layer having at least one metallic feature. In some embodiments, the metallic features comprise different portions of a via that extends through the different layers. This example is not intended to be limiting.

The bars, pillars, vias, and/or other features may be etched into or on the substrate (e.g., into one or more layers on the substrate), deposited on a substrate, covered by a deposition layer, and/or have other properties. Target (portion) 30 (e.g., of bars, pillars, vias, etc.) is sensitive to changes in processing in the patterning process (e.g., optical aberration in the lithographic projection apparatus such as in the projection system, focus change, dose change, etc.) such that process variation manifests in variation in target 30. Accordingly, the measured data from target 30 may be used to determine an adjustment for one or more of the manufacturing processes, and/or used as a basis for making the actual adjustment.

For example, the measured data from target 30 may indicate overlay for two layers of a semiconductor device. The measured data from target 30 may be used (e.g., by the one or more processors) for determining one or more semiconductor device manufacturing process parameters based the relative positions of the different layers of the semiconductor device, and determining an adjustment for a semiconductor device manufacturing apparatus based on the one or more determined semiconductor device manufacturing process parameters. In some embodiments, the one or more determined semiconductor device manufacturing process parameters comprise a mask design, a metrology target design, a semiconductor device design, an intensity of the radiation, an incident angle of the radiation, a wavelength of the radiation, a pupil size and/or shape, a resist material, and/or other process parameters.

Angle resolved scatterometry is useful in the measurement of asymmetry of features in product and/or resist patterns. A particular application of asymmetry measurement is for the measurement of overlay. The base concepts of asymmetry measurement using system 10 of FIG. 4 or FIG. 5 are described, for example, in U.S. patent application publication US2006-066855, which is incorporated herein in its entirety. In brief, for such overlay measurement, while the positions of the diffraction orders in the diffraction spectrum of the target are determined only by the periodicity of the target, asymmetry in the diffraction spectrum is indicative of asymmetry in the individual features which make up the target. In the system of FIG. 5, where detector 18 may be an image sensor, such asymmetry in the diffraction orders appears directly as asymmetry in the pupil image recorded by detector 18. This asymmetry can be measured by digital image processing in unit PU, and calibrated against known values of overlay.

Figure 6:
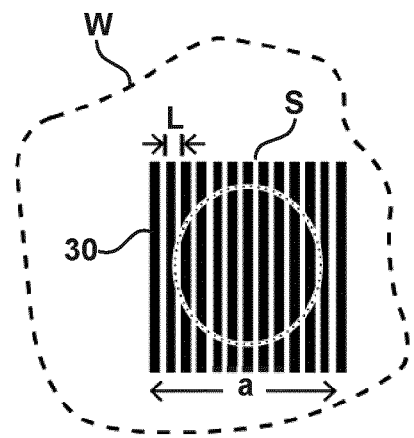
FIG. 6 illustrates the relationship between an illumination spot of an inspection system and a metrology target, according to an embodiment.

FIG. 6 illustrates a plan view of a typical target 30, and the extent of illumination spot S in the system of FIG. 5. Typically, to obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. The illumination arrangement 2, 12, 113, 17 (FIG. 5) may be configured to provide illumination of a uniform intensity across a back focal plane of objective 15. Alternatively, by, for example, including an aperture in the illumination path, illumination may be restricted to on axis or off axis directions. Advantageously, the present systems and methods do not require these same characteristics. As described above, target 30 may include a target portion of the structure of a substrate comprising metallic features in different layers of the structure and/or other target portions. The target portion (e.g., target 30) may be formed by any portion of a pattern that includes such layers and metallic features. In other words, target 30 need not be limited to a specific overlay target as described above. This is because the present systems and methods are configured to utilize resonances of any metallic features in layers of a semiconductor device structure to determine overlay. A periodic grating structure is not required.

Figure 7:
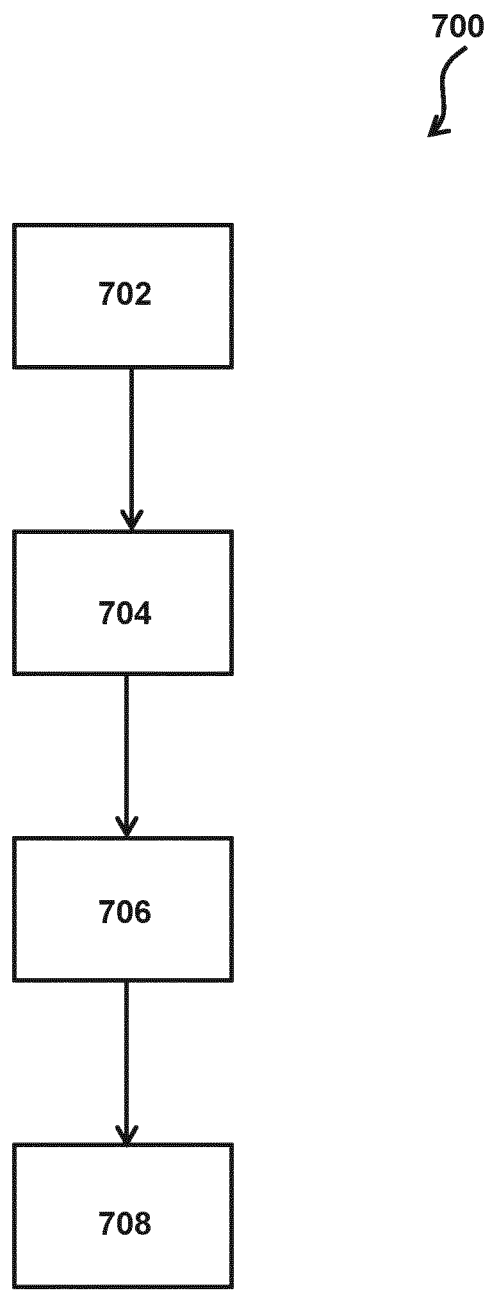
FIG. 7 illustrates a method for determining relative positions of different layers in a structure, according to an embodiment.

FIG. 7 illustrates a method 700 for determining whether (e.g., first and second) metallic features in different (e.g., first and second) layers in a structure are in electrical contact with each other. In some embodiments, this may include determining relative positions of different layers in the structure. In some embodiments, determining whether metallic features in different layers in a structure are in electrical contact with each other and/or determining the relative positions of the different layers in the structure is performed as part of a semiconductor device manufacturing process where the structure forms at least part of a semiconductor device (e.g., as described herein). In some embodiments, one or more operations of method 700 may be implemented in or by system 10 illustrated in FIGS. 4 and 5, and/or in or by other systems, for example. In some embodiments, method 700 comprises irradiating 702 a target portion of a structure with radiation, detecting 704 one or more resonances in reflected radiation from metallic features in the structure, determining 706 whether the metallic features in different layers are in electrical contact with each other and/or determining the relative positions of different layers of the structure, and/or other operations. Prior systems do not utilize a method similar to and/or the same as method 700 to take advantage of the resonances of metallic features. Method 700 may be generally applied to a number of different processes where detecting resonances in radiation reflected from metal features is useful.

As described herein, method 700 is optically based and does not require the same system components required for a voltage contrast based method. For example, operation 702 comprises irradiating a target portion of a structure with radiation. In some embodiments, the radiation comprises visible light and/or other radiation. In some embodiments, the radiation comprises broadband white light projected from a radiation source. The radiation is directed onto the target portion of the structure. In some embodiments, the radiation may be collimated using a lens system and transmitted through an interference filter, a polarizer, and/or other components.

In some embodiments, the structure comprises at least a portion of a semiconductor device. The target portion comprises metallic features in different layers of the structure. The different layers may comprise two (or more) layers, each layer having at least one metallic feature. The metallic features can form some or all of a specifically designed metrology mark and/or be part of an actual semiconductor device. The metallic features may have any, size, shape, and/or arrangement that allows the present systems and methods to function as described herein. As a non-limiting example, the metallic features may have a size that is on the order of 50 nm or less. The metallic features may be part of a semiconductor device pattern, and/or be arranged in other ways. By way of another non-limiting example, the metallic features may comprise different portions of a via in a semiconductor device that extends through the different layers. In some embodiments, operation 702 may be performed by a radiation source similar to or the same as source 2 shown in FIGS. 4 and 5 and described above, and/or other sources, for example.

Operation 704 comprises detecting one or more resonances in reflected radiation from metallic features in the structure. Radiation from operation 702 is reflected by metallic features in the structure. Since light can only be focused up to its diffraction limit, the reflected radiation is from metallic features in an entire illumination spot associated with the incident radiation. (Therefore, this technique can help in identifying regions of a semiconductor device having defects. The present methods and system can also be used to guide voltage contrast inspection.) The reflected radiation is passed to a sensor such as a spectrometer detector and/or other sensors, which measures a spectrum (intensity as a function of wavelength) of the reflected radiation. Such a sensor may be configured as a normal-incidence inspection apparatus (e.g., where the sensor is oriented at an angle normal to the structure), an oblique-incidence inspection apparatus, and/or have other configurations. Resonance(s) can be detected in the radiation reflected from the metallic features in the layers of a structure such as a semiconductor device (e.g., the reflected signal or spectrum used for an optical measurement) irrespective of the diffraction order of the radiation.

In some embodiments, the one or more resonances comprise plasmon resonances. Plasmon resonances are coupled oscillation of free electrons in metal with incident radiation that arise in the presence of metal-dielectric interfaces. This appears in the far-field scattering/reflection spectrum in the form of a dipolar resonance. For complex geometries, there might also be additional smaller resonant peaks in far-field spectra which are only marginally visible above the background spectrum. The wavelength of plasmon resonances is sensitive to both geometry and material. Therefore, when two particles (e.g., metallic features) are in physical contact or in close proximity with each other, the resonance wavelength shifts as a function of the environment. In cases where two particles (metallic features), that individually have resonance at the same wavelength, have lost contact, their individual resonances couple, leading to a so-called spectral split whereby two resonances appear. The physical separation between the two particles is inversely related to the spectral distance between (and/or spectral positions of) the two resulting resonances.

An individual resonance may comprise an intensity maximum in the wavelength spectrum of the reflected radiation. Detecting the one or more resonances may comprise identifying maximums in the intensity of the reflected radiation across the wavelength spectrum. This may be performed by a processor (e.g., by electronically comparing intensities of different wavelengths of reflected radiation), and/or by other components. In some embodiments, if (e.g., first and second) metallic features in different (e.g., first and second) layers comprise different metals and/or have different dimensions, this may cause one or more resonances in the reflected radiation to be detected by the one or more sensors, and the (first and second) metallic features in the (first and second) layers are determined to be in electrical contact or out of electrical contact with each other based on spectral positions of the one or more resonances (e.g., as shown in the figures). As an example, at least two different resonances in reflected radiation may be detected. The metallic features in the different layers may be determined to be in electrical contact or out of electrical contact with each other based on a distance between the at least two different resonances.

However, in some cases, only one resonance may remain visible while the other gets washed due to high absorption. Furthermore, there can be a case where all resonances get washed out due to absorption losses. For example, it could be that when both particles are in contact, no visible resonance is seen. But when they lose contact, one or more resonances move to frequencies where material losses are minimal, allowing observation. In this situation, a prediction may still be made by assuming no resonance means features are in contact, and presence of a resonance means features are out of contact.

Figure 8A:
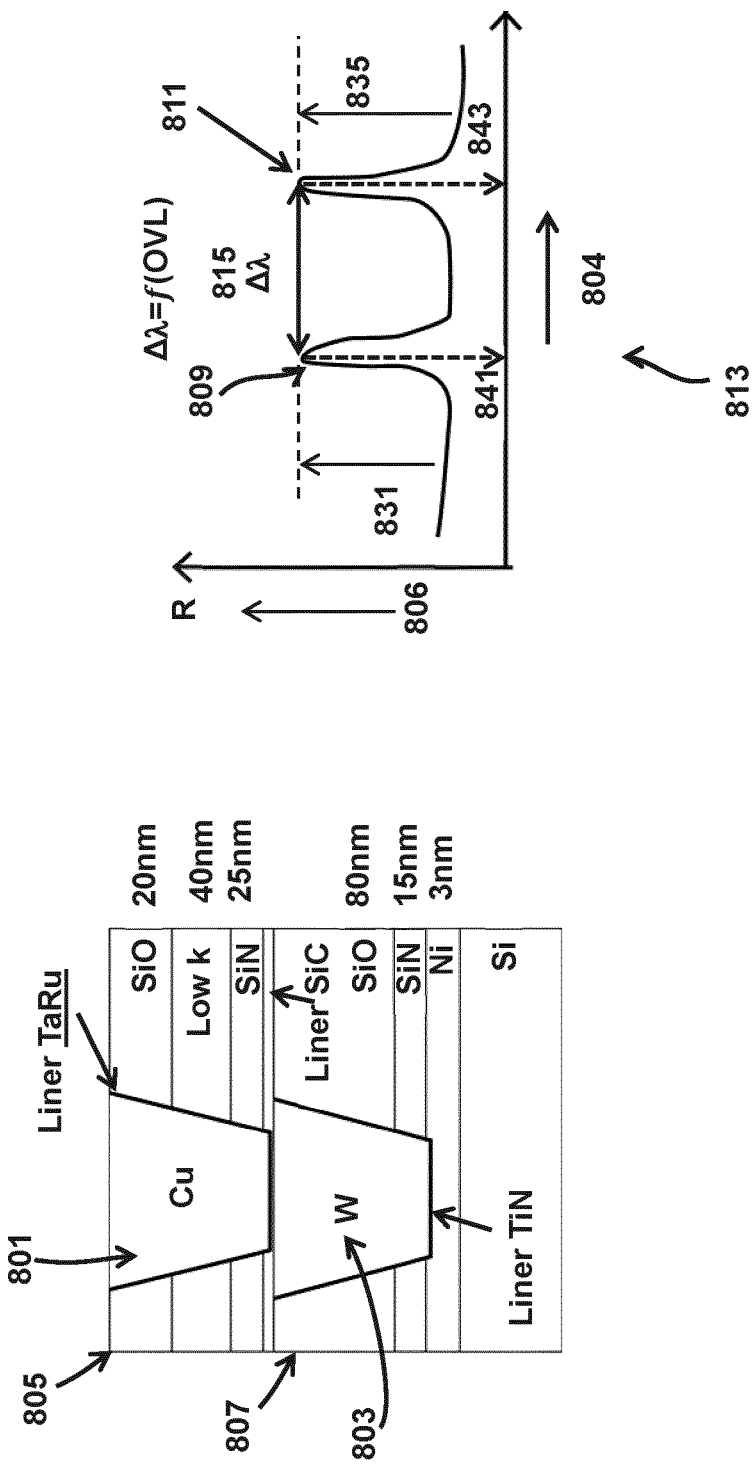
FIG. 8A illustrates metallic features in different layers comprising different metals, and two corresponding detected resonances in reflected radiation, according to an embodiment.

In some embodiments, if the metallic features in the different layers are formed from the same metal and have the same dimensions, a single resonance associated with the metallic features is detected if the metallic features are in contact with each other, and two (or more) resonances may be detected if the metallic features are not in contact with each other. By way of a non-limiting example of these different cases, FIG. 8A illustrates metallic features 801 (e.g., a first metallic feature, 803 (e.g., a second metallic feature) (different portions of a via, or any other geometry) comprising different metals in different layers 805 (e.g., a first layer), 807 (e.g., a second layer) of a semiconductor device, and two corresponding detected resonances 809, 811 in reflected radiation. In this example, metallic features 801 and 803 are formed from copper (Cu) and Tungsten (W). In this example, features 801 and 803 are surrounded by TaRu and TiN liners, respectively, and layers 805 and 807 include various sub-layers (e.g., formed by SiO, Low k, SiN, Ni, Si, etc.).

FIG. 8A illustrates an example view 813 of wavelength 804 versus intensity 806 for reflected radiation. The radiation may be reflected from metallic features 801, 803 in a structure (e.g., in layers 805, 807 of a semiconductor device), for example. View 813 illustrates the spectral positions of two resonances (maximums) 809 and 811 in intensity 806 across wavelengths 804. The metallic features 801, 803 in the different layers 805, 807 are determined to be in electrical contact or out of electrical contact with each other based on the spectral positions of (e.g., a distance 815 between) the two different resonances 809, 811 (as described below).

Figure 8B:
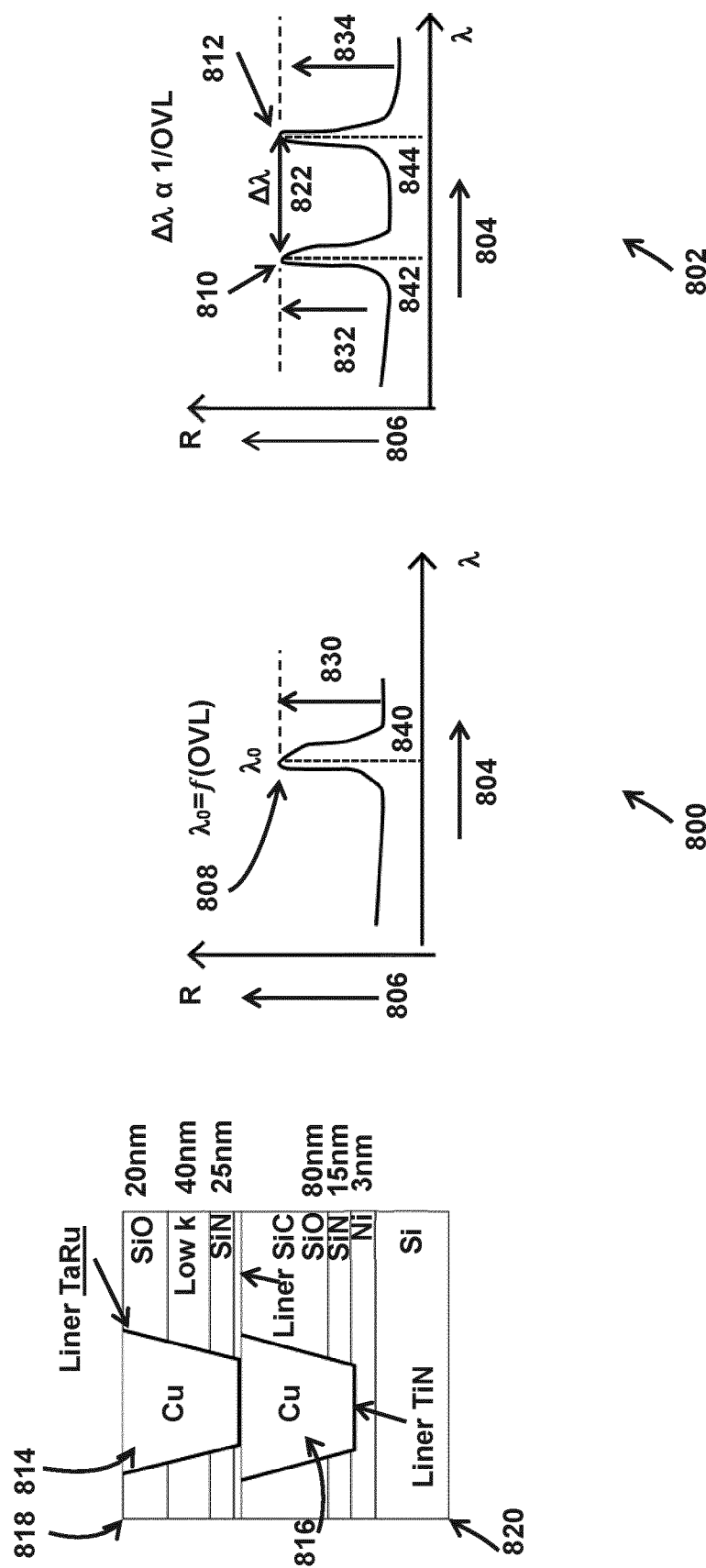
FIG. 8B illustrates metallic features in different layers comprising the same metal and the same dimensions, and corresponding example detected resonances showing in contact and out of contact features, according to an embodiment.

By way of a second non-limiting example, FIG. 8B illustrates metallic features 814 (e.g., a first metallic feature), 816 (e.g., a second metallic feature) in different layers 818 (e.g., a first layer), 820 (e.g., a second layer) comprising the same metal and the same dimensions, and corresponding spectral positions of example detected resonances 808, 810, 812 showing in electrical contact (resonance 808) and out of electrical contact (resonances 810 and 812) features 814 and 816. In this example, metallic features 814 and 816 are both formed from copper (Cu) and have substantially the same dimensions. In this example, features 814 and 816 are surrounded by TaRu and TiN liners, respectively, and layers 818 and 820 include various sub-layers (e.g., formed by SiO, Low k, SiN, Ni, Si, etc.).

When the two metallic features 814, 816 (e.g., different portions of a via, or any other geometry) are in electrical contact with each other, they optically behave as one feature, exhibiting one dipolar surface plasmon polariton resonance to radiation from the radiation source. The resonance(s) in the reflected radiation depend on the extent of electrical contact between metal features in different layers of a semiconductor device structure. For example, if two metallic features in different layers of a structure are in electrical contact, there will be one dipolar resonance in the reflected radiation. If the two metallic features have lost electrical contact, then for the incident radiation they are two different features each having their own dipolar resonances. These resonances hybridize or get coupled, leading to two resonances in the reflected radiation.

FIG. 8B illustrates two example views 800, 802 of wavelength 804 versus intensity 806 for reflected radiation. The radiation may be reflected from metallic features 814, 816 in a structure (e.g., in layers 818, 820 of a semiconductor device), for example. View 800 illustrates one resonance (maximum) 808 (e.g., at $\lambda_0$), while view 802 illustrates two resonances (maximums) 810 and 812 in intensity 806 across wavelengths 804. This means the reflected radiation associated with view 800 has come from metallic features 814, 816 in different layers 818, 820 of a semiconductor device (for example) that are in electrical contact with each other and optically behave as a single object. The reflected radiation associated with view 802 has come from metallic features 814, 816 in different layers 818, 820 of a semiconductor device (for example) that are not in electrical contact with each other and optically behave as two separate objects.

Returning to FIG. 7, in some embodiments, operation 704 may be performed by detectors similar to or the same as detectors 4 and/or 18, and/or one or more processors similar to or the same as processor PU, shown in FIGS. 4 and 5 and described above.

Operation 706 comprises determining whether the (e.g., first and second) metallic features in the different (e.g., first and second) layers are in electrical contact with each other based on the detected one or more resonances and/or other information. Determining whether the metallic features in the different layers are in electrical contact with each other may be based on the spectral position(s) of the one or more resonances. For example, if the metallic features in different layers comprise different metals and/or have different dimensions, at least two different resonances (maximums) in reflected radiation may be detected. The metallic features in the different layers are determined to be in electrical contact or out of electrical contact with each other based on a distance between the at least two different resonances (maximums). In some embodiments, if the metallic features in the different layers are formed from the same metal and have the same dimensions, a single resonance (maximum) associated with the metallic features is detected if the metallic features are in contact with each other, and two (or more) resonances (maximums) may be detected if the metallic features are not in contact with each other. In some embodiments, a distance between resonances corresponds to an amount the different features are shifted (or are out of electrical contact) relative to each other.

For example, operation 706 comprises determining whether the metallic features in different layers are in electrical contact with each other based on the detected one or more resonances and/or other information. In some embodiments, as described above, the metallic features in different layers comprise different metals and/or have different dimensions, which cause at least two different resonances in the reflected radiation to be detected by the one or more sensors, and the metallic features in the different layers are determined, by the one or more processors, to be in contact or out of contact with each other based on a distance between the at least two different resonances. In some embodiments, as described above, the metallic features in the different layers are formed from the same metal and have the same dimensions, and the one or more processors are configured such that the metallic features in the different layers are determined to be in contact with each other responsive to detection of a single resonance associated with the metallic features and out of contact with each other responsive to detection of two or more resonances associated with the metallic features.

In some embodiments, operation 706 comprises determining relative positions of different layers of the structure. The relative positions may be determined based on the detected one or more resonances and/or other information. In some embodiments, determining the relative positions of the different layers comprises determining a relative shift between the different layers. This may include determining an alignment, and/or other indications of relative shift between layers. In some embodiments, determining the relative positions of the different layers comprises determining overlay associated with the different layers. Overlay may be determined as part of a semiconductor device manufacturing process, for example (as described herein).

By way of a non-limiting example, returning to FIG. 8A, resonances indicated by resonances (maxima) 809 and 811 (and/or other maxima) can be used to determine relative positions of different layers of the structure, a relative shift between the different layers, whether metallic features in the different layers are in or out of electrical contact, overlay, and/or other information. Resonances indicated by (maxima) 809 and 811 can be used to determine relative positions of different layers of the structure, a relative shift between the different layers, whether metallic features in the different layers are in or out of electrical contact, overlay, and/or other information for a semiconductor device and/or a semiconductor manufacturing process, for example. Separation distance 815 between the two resonances (e.g., maxima) 809 and 811; the relative intensities 831 and 835 (e.g., the heights of the peaks that indicate the maxima) of resonances 809 and 811 in the reflected radiation; the location 841 and 843 of a resonance (maximum); and or other information may be used to determine relative positions of different layers of the structure, a relative shift between the different layers, whether metallic features in the different layers are in or out of electrical contact, an amount of overlay, and/or other information. For example, metallic features 801 and 803 in different layers 805 and 807 may be determined to be in contact or out of electrical contact with each other based on a distance (e.g., 815) between the (at least two) different resonances 809 and 811. The distance (e.g., 815) between the (at least two) different resonances corresponds to an amount different layers 805 and 807 are shifted relative to each other.

Overlay, for example, may be determined based on detected resonances because the separation distance 815 (e.g., $\Delta\lambda$) between the locations (e.g. 841 and 843) of resonances (maxima) 809 and 811 is a function of overlay according to the equation $\Delta\lambda = f(OVL)$, where $\Delta\lambda$ indicates the distance across the wavelength ($\lambda$) spectrum between individual resonances (e.g., 815 in this example) and OVL stands for overlay. In some embodiments, one or more thresholds may be determined for one or more of separation distance 815, relative intensities 831 and 835, locations 841 and 843, and/or other parameters such that responsive to a breach of one or more of these thresholds, features 801 and 803 may be determined to be out of contact. These same relationships apply to more broadly determining the relative positions of different layers of the structure, a relative shift between the different layers, whether metallic features in the different layers are in or out of contact, etc. (e.g., similar determinations that are not specifically determining overlay).

The structure shown in FIG. 8B, wherein metallic features 814 and 816 are both formed from copper and have substantially the same dimensions, may be thought of as a special case relative to the structure shown in FIG. 8A. In FIG. 8B, resonances indicated by (maxima) 808, 810, and/or 812 can again be used to determine relative positions of different layers of the structure, a relative shift between the different layers, whether metallic features in the different layers are in or out of electrical contact, overlay, and/or other information. Resonances indicated by (maxima) 808, 810, and/or 812 can be used to determine relative positions of different layers of the structure, a relative shift between the different layers, whether metallic features in the different layers are in or out of electrical contact, and/or overlay for a semiconductor device and/or a semiconductor manufacturing process, for example. Separation distance 822 between two resonances (e.g., maxima 810 and 812); the relative intensities 830, 832, and 834 (e.g., the heights of the peaks that indicate the maxima) of resonances 808, 810, and/or 812 in the reflected radiation; the location 840, 842, and/or 844 of a resonance (maximum); and or other information may be used to determine relative positions of different layers of the structure, a relative shift between the different layers, whether metallic features in the different layers are in or out of electrical contact, an amount of overlay, and/or other information.

Overlay, for example, may be determined based on detected resonances because the locations (e.g., $\lambda_0$) of resonances (maxima) are a function of overlay according to the equation $\lambda_0 = f(\text{OVL})$, where $\lambda_0$ indicates the location of an individual resonance (e.g., 808 in this example) and OVL again stands for overlay; and because overlay is inversely proportional to separation distance 822 between resonances (e.g., 810 and 812) according to the equation OVL $\alpha$ $1/\Delta\lambda$ in this special case.

Views 800 and 802 of FIG. 8B illustrate exemplary spectrums of reflected radiation for in electrical contact identical (e.g., same metal, same geometry) metallic features 814, 816 (view 800) and out of electrical contact identical metallic features 814, 816 (view 802) as generally found in subwavelength plasmonic structures. This means that view 800, showing a single resonance (maximum) 808 indicates that metallic features 814, 816 in different layers of the structure (in that target portion) are in electrical contact with each other, and there is little relative shift between layers. In some embodiments, the intensity 830, the location 840, a shape, and/or other properties of resonance (maximum) 808 may indicate whether the corresponding metallic features 814, 816 are (in electrical contact and) perfectly aligned, or if they are shifted relative to each other but still in electrical contact.

View 802 illustrates how, for out of electrical contact identical metallic features 814, 816, a single resonance 808 (for in contact metallic features) splits into two resonances 810 and 812 when two metallic features 814, 816 (e.g., in different layers) are in close proximity, but no longer in electrical contact. As described above, overlay (as just one example of an optically determined method that may benefit from the techniques descried herein) is inversely proportional to separation distance 822 between resonances 810 and 812. Thus, by determining the distance between resonances 810 and 812, overlay between the layers that include the identical metallic features 814, 816 that cause resonances 810 and 812 can be determined. Since overlay is inversely proportional to separation distance 822 in this example, the closer resonances 810 and 812 are to each other, the larger the corresponding overlay. Conversely, the farther resonances 810 and 812 are from each other, the smaller the corresponding overlay (up to the point a resonance maximum is associated with different metallic features).

As a non-limiting example, consider square metal blocks (metallic features) of side length 40 nm in both an upper and a lower (or buried) layer. Both layers may have a pitch of 100 nm. From a computational solution of the Maxwell's equations, a spatial separation of 5 nm between the edges of the blocks in top and buried layer (overlay of 25 nm) causes a resonance split of 100 nm whereas a separation of 25 nm (45 nm overlay) leads to a resonance split of 10 nm between peaks in the reflected spectrum. Intermediate separation values will cause intermediate separation in wavelength of the two reflection peaks in some possibly non-linear relationship with overlay. The observed separation of peaks in measurements is then compared with the computation results to determine the underlying gap between the blocks in upper and lower layers.

In some embodiments, the metallic features (e.g., 801, 803, 814, 816 shown in FIGS. 8A and 8B) in the different layers (e.g., 805, 807, 818, 820 shown in FIGS. 8A and 8B) of the structure are arranged in an array. An array may be a patterned periodic arrangement of features. The patterned periodic arrangement of features may have rows, columns, and/or other periodic arrangements of features. The array may have a pitch. The pitch may be a distance between rows and/or columns of the array, for example. In these embodiments, detecting the one or more resonances in the reflected radiation from the metallic features (e.g., operation 704 described above and shown in FIG. 7) comprises detecting a resonance associated with the pitch. This resonance associated with the pitch may be a Fano resonance, and/or other resonances, for example.

In some embodiments, the resonance associated with the pitch has a resonance shape. The electrical contact between features, and/or the relative positions of the different layers may be determined (e.g., operation 706 described above and shown in FIG. 7) based on the resonance shape and/or other information.

Figure 9:
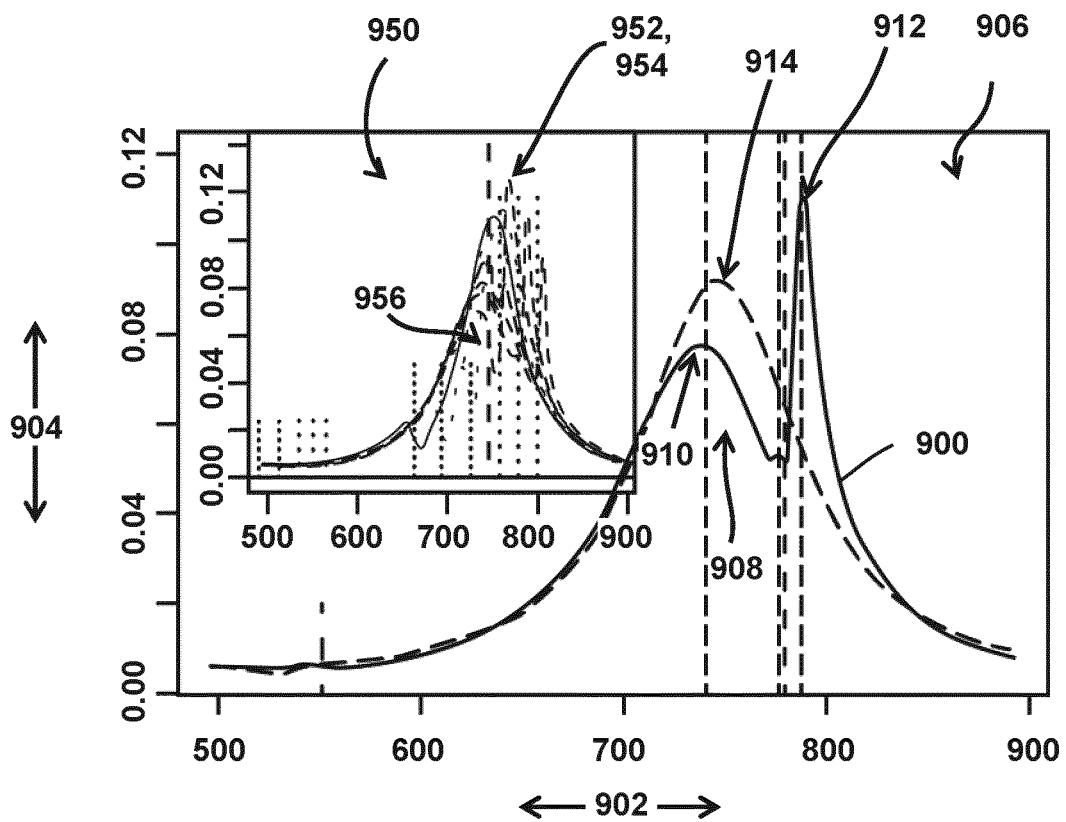
FIG. 9 illustrates a detected resonance associated with a pitch, according to an embodiment.

By way of a non-limiting example, FIG. 9 illustrates a detected resonance 900 associated with a pitch. Resonance 900 is shown in a wavelength 902 versus intensity 904 plot 906. The resonance has a resonance shape 908. In this example, shape 908 comprises a two peaked shape with one peak 910 being shorter and rounder compared to a second peak 912. FIG. 9 also illustrates an example resonance 914 (e.g., a plasmon resonance) from an individual metallic feature (e.g., a resonance similar to or the same as a resonance shown in FIG. 8A or 8B). When a resonance associated with an array (e.g., Fano resonance 900) overlaps with a resonance of a metallic feature (e.g., plasmon resonance 914), the resonances interfere, and the shape 908 of resonance 900 forms a prominent signature (e.g., the two peaked shape in this example) indicative of the interference. This prominent signature is related to whether or not features are in electrical contact and/or the relative positions of the different layers associated with the features in a structure. Determining whether the features are in electrical contact and/or the relative positions of the different layers may be based on the resonance associated with the pitch (e.g., the prominent signature shown by shape 908). For clarity, in these cases, the pitch or plasmonic resonances of the metallic features are normally not seen clearly (e.g., the line showing 914 is normally not visible). What is observed, i.e. 900 of FIG. 9, is the collective response which is known as the Fano resonance.

For example, the interference between resonances 900 (Fano) and 914 (plasmon) depends on whether or not corresponding metallic features are in electrical contact and/or the alignment of the individual metallic object associated with resonance 914 with the rest of the array. (It should be noted that the Fano shape is the name for the overall asymmetric spectrum, as opposed to a clean Lorentzian line shape associated with the individual plasmon and/or pitch resonances.) Shape 908 of resonance 900 changes as the alignment of the individual metallic object changes. For example, a perfectly aligned (with the rest of the array) metallic object will (be in electrical contact with another metallic object and) cause one shape 908 of resonance 900, while a misaligned (or out of electrical contact) metallic object will cause a different shape 908. In addition, shape 908 progressively changes as the metallic object is more or less aligned (or misaligned—out of electrical contact—in one direction or another). This is illustrated in the insert 950 shown in FIG. 9. Shape 952 of a resonance 954 associated with a pitch progressively changes as the alignment 956 of an individual metallic feature changes relative to the rest of the array.

In some embodiments, shape 908 of resonance 900 may be compared to a database of various shapes of pitch related Fano resonances and corresponding overlay values to determine overlay associated with shape 908 and/or resonance 900. In some embodiments, characteristics of shape 908 of resonance 900 may be compared to a database of various characteristics of pitch related Fano resonances and corresponding overlay values to determine overlay associated with shape 908 and/or resonance 900. For example, a location, height, width, slope, and/or other features of peak 912 and/or 910 may be compared to database values for these features and corresponding overlay (and/or other indications of alignment) values.

In some embodiments, the pitch of the array may be adjusted based on the resonance associated with the pitch. For example, for a given material-geometry of metallic features, the pitch may be chosen such that the array resonance coincides with one of the plasmon resonances. This may include adjusting the pitch until the Fano resonance associated with the pitch (and arising due to the pitch resonance) has a shape that substantially matches a data base shape that indicates alignment, for example, and/or other operations. In some embodiments, a reason Fano resonances are promising for this work is that their spectral features are generally far more sensitive to geometry than ordinary plasmon resonances, which are themselves reputed to be very sensitive to their environment. That is why it may be advantageous to design a mark and/or other structures in a way to involve the pitch resonance so as to get Fano line shapes in the measured spectrum. This is unique to mark design only in optical inspection. If marks are designed for VC inspection, pitch is irrelevant Returning to FIG. 7, in some embodiments, operation 706 may include outputting an indication of whether the metallic features in the different layers are in or out of contact with each other, an amount of a relative shift between layers, an indication of overlay, a manufacturing process failure rate, a critical dimension, a critical dimension variance, and/or other information associated with a target portion of a structure (e.g., a target portion of a semiconductor device). These metrics may be determined based on the detected resonances (e.g., as described above), and/or based on other information. The indication may be displayed on a display associated with system 10 (FIGS. 4 and 5), for example, and/or other displays. In some embodiments, the indication may comprise a graphical representation similar to or the same as one of the graphs shown in FIGS. 8A and/or 8B, a number indicative of the relative shift between layers, a number indicative of overlay, an overlay and/or other operational process pass/fail indication (e.g., colors indicating pass fail, etc.), and/or other information. In some embodiments, operation 706 may be performed by one or more processors similar to or the same as processor(s) PU shown in FIGS. 4 and 5 (and/or processor(s) 104 and 105 described below) and described herein.

In some embodiments, method 700 includes determining one or more semiconductor device manufacturing process parameters based on whether metallic features are in or out of electrical contact with each other and/or the relative positions of the different layers, determining an adjustment for a semiconductor device manufacturing apparatus (e.g., LA shown in FIG. 2) based on the one or more determined semiconductor device manufacturing process parameters, adjusting the semiconductor device manufacturing apparatus based on the determined adjustment, and/or other operations 708.

For example, if two metallic features in two layers of a semiconductor device are out of electrical contact with each other (e.g., the layers are misaligned), the non-contact (e.g., the misalignment) may be caused by one or more manufacturing processes whose process parameters have drifted and/or otherwise changed so that the process is no longer producing acceptable devices (e.g., overlay measurements may breach a threshold for acceptability). One or more new or adjusted process parameters may be determined based on the relative positions of the different layers (e.g., the determination of whether the metallic features are in or out of electrical contact with each other). The new or adjusted process parameters may be configured to cause a manufacturing process to again produce acceptable devices. For example, a new or adjusted process parameter may cause a previously unacceptable amount of overlay to be reduced back into an acceptable range. The new or adjusted process parameters may be compared to existing parameters for a given process. If there is a difference, that difference may be used to determine an adjustment for an apparatus that is used to produce the devices (e.g., parameter "x" should be increased/decreased/changed so that it matches the new or adjusted version of parameter "x" determined as part of operation 708), for example. In some embodiments, operation 708 may include electronically adjusting an apparatus (e.g., based on the determined process parameters). Electronically adjusting an apparatus may include sending an electronic signal, and/or other communications to the apparatus, for example, that causes a change in the apparatus. The electronic adjustment may include changing a setting on the apparatus, for example, and/or other adjustments. It should be noted that process parameters can be interpreted broadly to include a mask design, a metrology target design, a semiconductor device design, an intensity of the radiation (used for exposing resist, etc.), an incident angle of the radiation, a wavelength of the radiation, a pupil size and/or shape, a resist material, and/or other parameters.

Figure 10:
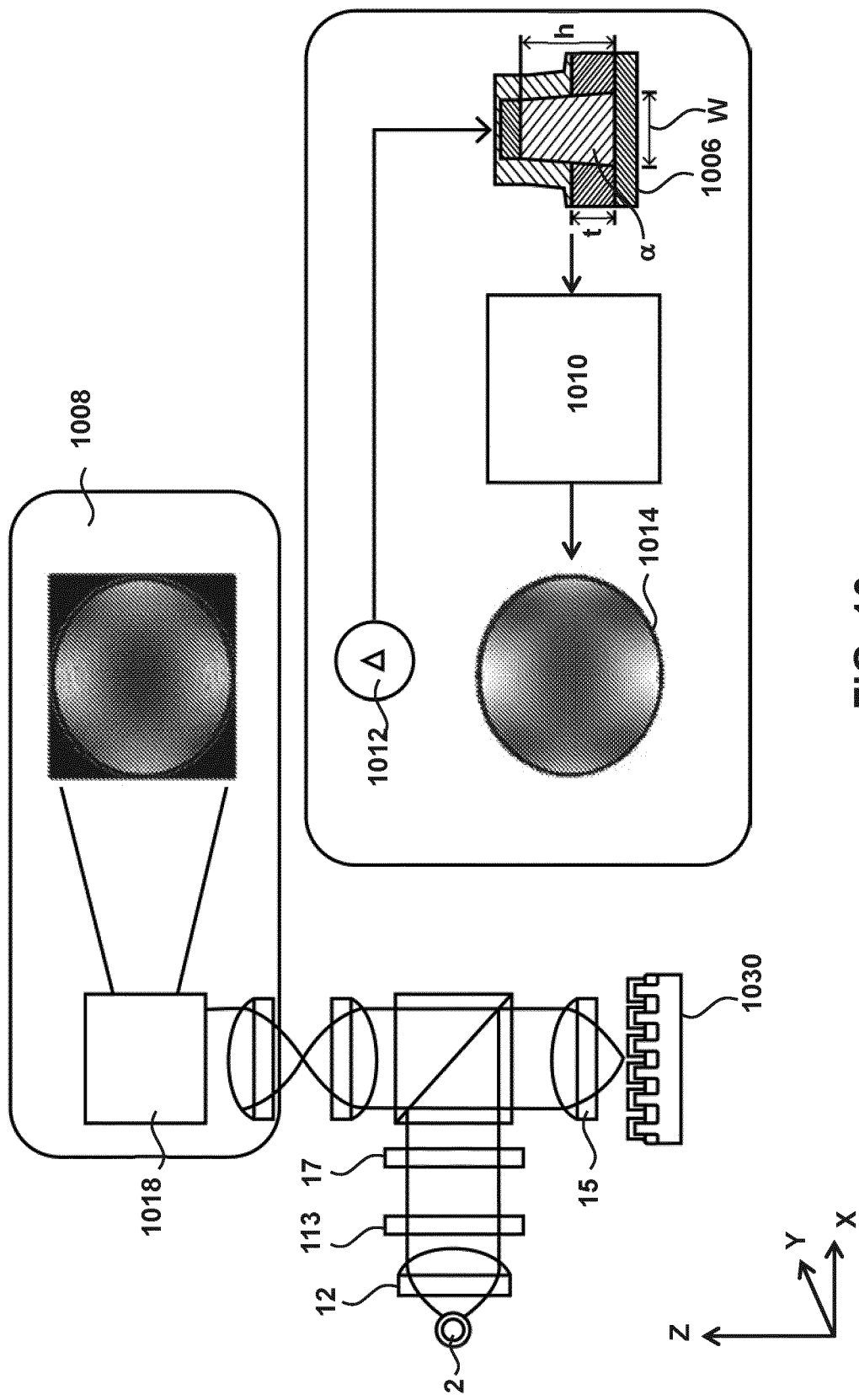
FIG. 10 schematically depicts a process of deriving a plurality of variables of interest based on measurement data, according to an embodiment.

FIG. 10 schematically depicts an example process of the determination of the value of one or more variables of interest of a target (pattern) 1030 based on measurement data obtained using metrology (e.g., overlay determined with the present systems and methods). Radiation detected by the detector 1018 provides a measured radiation distribution 1008 for target 1030, which can be used for determining overlay, etc. as described herein. For a given target 1030, a radiation distribution 1014, overlay, etc., can be computed/simulated from a parameterized model 1006 using, for example, a numerical Maxwell solver 1010. The parameterized model 1006 shows example layers of various materials making up, and associated with, the target. The parameterized model 1006 may include one or more of variables for the features and layers of the portion of the target under consideration, which may be varied and derived. As shown in FIG. 10, the one or more of the variables may include the thickness t of one or more layers, a width w (e.g., CD) of one or more features, a height h of one or more features, and/or a sidewall angle α of one or more features. Although not shown, the one or more of the variables may further include, but is not limited to, the refractive index (e.g., a real or complex refractive index, refractive index tensor, etc.) of one or more of the layers, the extinction coefficient of one or more layers, the absorption of one or more layers, resist loss during development, a footing of one or more features, and/or line edge roughness of one or more features. The initial values of the variables may be those expected for the target being measured. The measured radiation distribution 1008, overlay, etc., is then compared to the computed radiation distribution 1012, overlay, etc., to determine the difference between the two. If there is a difference, the values of one or more of the variables of the parameterized model 1006 may be varied, a new computed radiation distribution 1012, overlay, etc. calculated and compared against the measured radiation distribution 1008, overlay, etc., until there is sufficient match between the measured radiation distribution 1008, overlay, etc., and the computed radiation distribution 1012, overlay, etc. At that point, the values of the variables of the parameterized model 1006 provide a good or best match of the geometry of the actual target 1030. In an embodiment, there is sufficient match when a difference between the measured radiation distribution 1008, overlay, etc., and the computed radiation distribution 1012, overlay, etc., is within a tolerance threshold.

Figure 11:
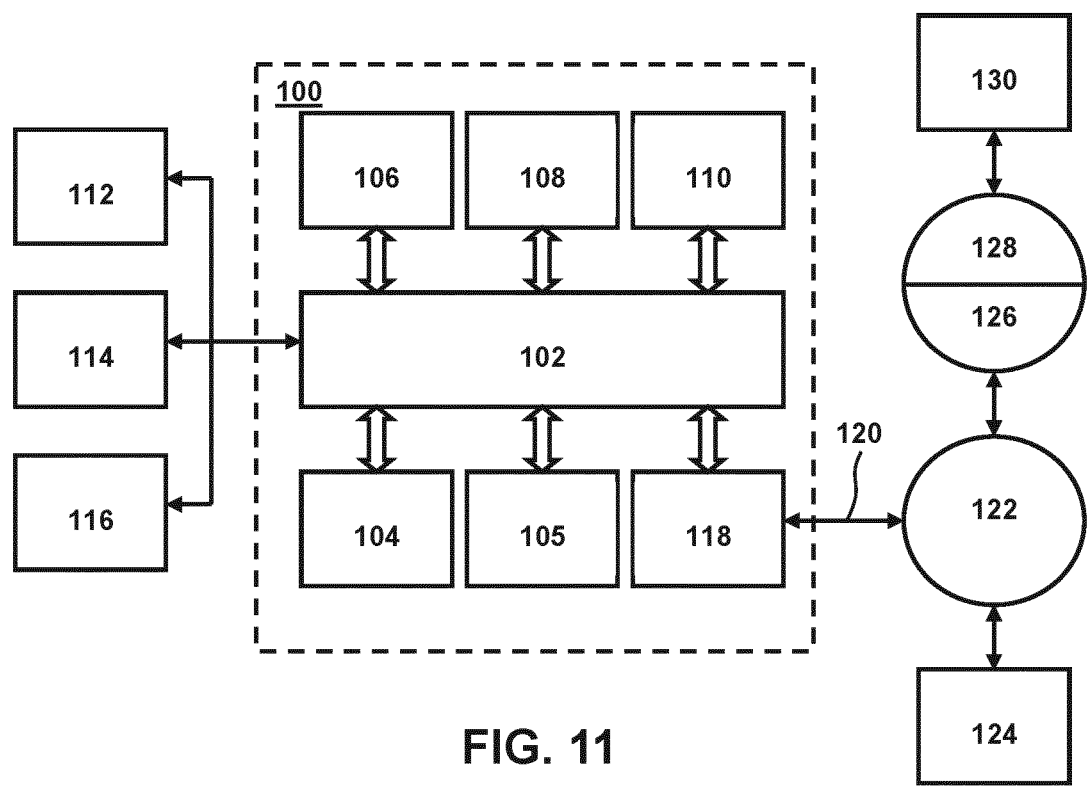
FIG. 11 is a block diagram of an example computer system, according to an embodiment.

FIG. 11 is a block diagram that illustrates a computer system 100 that can assist in implementing the methods, flows or the system(s) disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide all or part of a method described herein, for example. The received code may be executed by processor 104 as it is received, and/or stored in storage device 110, or other non-volatile storage for later execution. In this manner, computer system 100 may obtain application code in the form of a carrier wave.

Figure 12:
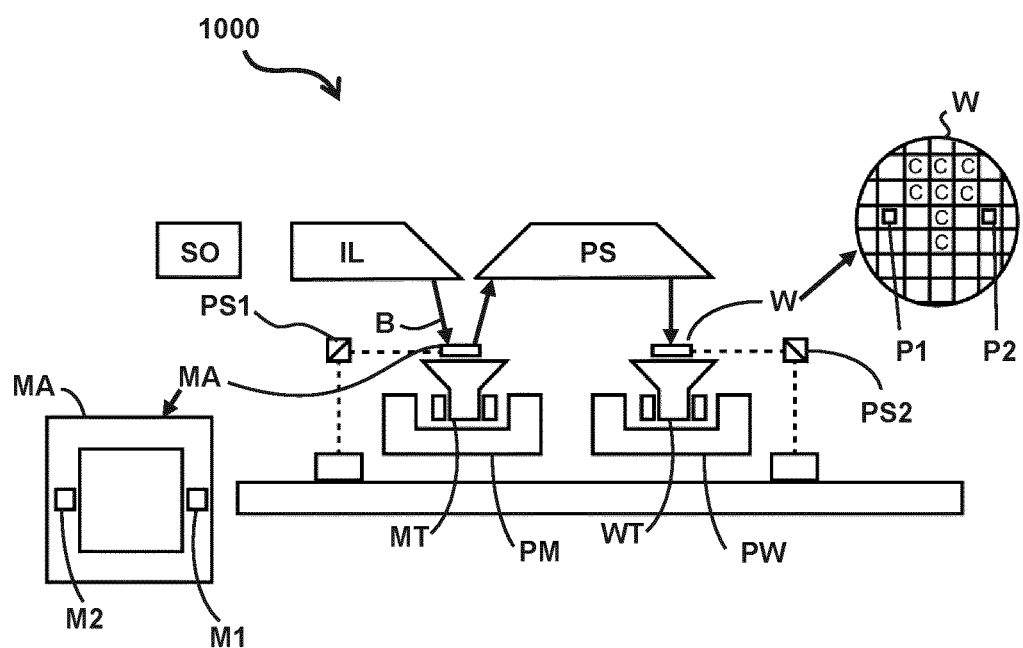
FIG. 12 is a schematic diagram of a lithographic projection apparatus similar to FIG. 2, according to an embodiment.

FIG. 12 schematically depicts an exemplary lithographic projection apparatus similar to and/or the same as the apparatus shown in FIG. 2 that can be used in conjunction with the techniques described herein. The apparatus 1000 comprises an illumination system IL, to condition a beam B of radiation. In this particular case, the illumination system also comprises a radiation source SO; a first object table (e.g., patterning device table) MT provided with a patterning device holder to hold a patterning device MA (e.g., a reticle), and connected to a first positioner PM (working in association with a first position sensor) PS1 to accurately position the patterning device; a second object table (substrate table) WT provided with a substrate holder to hold a substrate W (e.g., a resist-coated silicon wafer), and connected to a second positioner PW (working in association with a second position sensor PS2) to accurately position the substrate; a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means for setting the outer and/or inner radial extent (commonly referred to as σ-outer and σ-inner, respectively) of the intensity distribution in the beam. In addition, it will generally comprise various other components, such as an integrator and a condenser. In this way, the beam B impinging on the patterning device MA has a desired uniformity and intensity distribution in its cross-section.

It should be noted with regard to FIG. 12 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam B subsequently intercepts the patterning device MA, which is held on a patterning device table MT. Having traversed the patterning device MA, the beam B passes through a lens, which focuses the beam B onto a target portion C of the substrate W. With the aid of the second positioning means (and interferometric measuring means), the substrate table WT can be moved accurately, e.g. to position different target portions C in the path of the beam B. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted. However, in the case of a stepper (as opposed to a step-and-scan tool) the patterning device table MT may just be connected to a short stroke actuator, or may be fixed.

The depicted tool (similar to or the same as the tool shown in FIG. 2) can be used in two different modes. In step mode, the patterning device table MT is kept essentially stationary, and an entire patterning device image is projected in one operation (i.e., a single "flash") onto a target portion C. The substrate table WT is then shifted in the x and/or y directions so that a different target portion C can be irradiated by the beam B. In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 13:
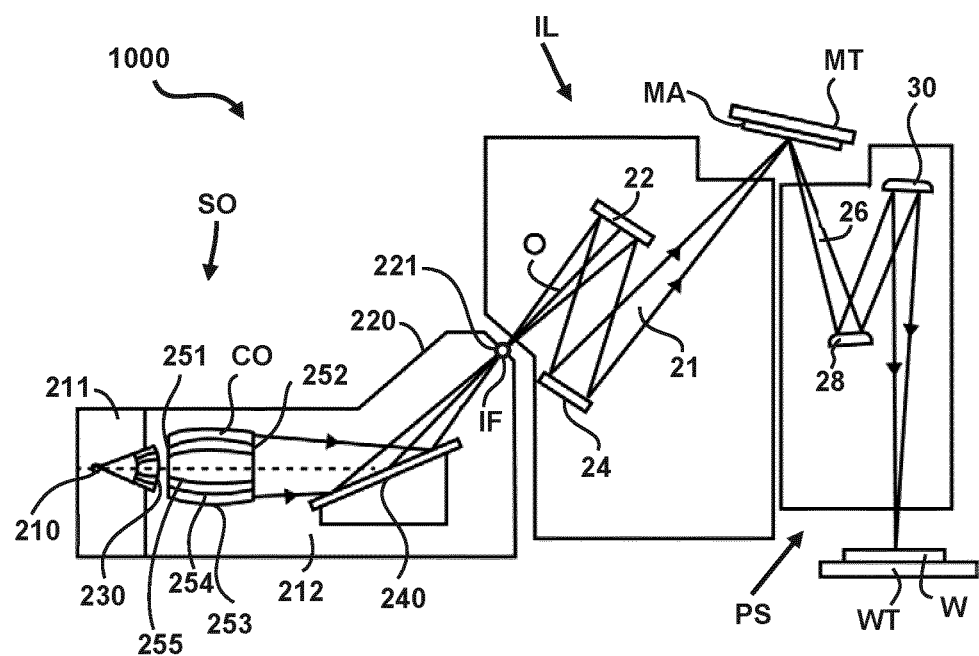
FIG. 13 is a more detailed view of the apparatus in FIG. 12, according to an embodiment.

FIG. 13 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the hot plasma 210 is created to emit radiation in the EUV range of the electromagnetic spectrum. The plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap 230 further indicated herein at least includes a channel structure.

The source chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 330 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 12.

Collector optic CO, as illustrated in FIG. 13, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 14:
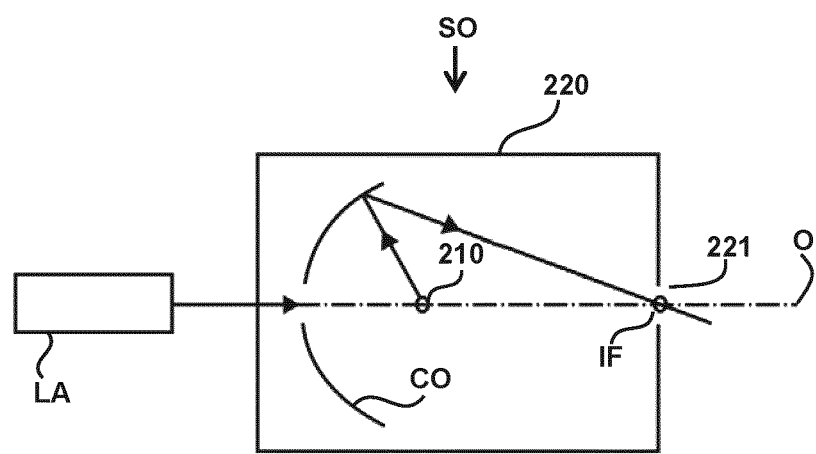
FIG. 14 is a more detailed view of the source collector module of the apparatus of FIG. 12 and FIG. 13, according to an embodiment.

Alternatively, the source collector module SO may be part of an LPP radiation system as shown in FIG. 14. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method for determining an adjustment for a semiconductor device manufacturing apparatus, the method comprising:
    irradiating a target portion of a semiconductor device with radiation, the target portion comprising metallic features in different layers of the semiconductor device;
    detecting one or more resonances in reflected radiation from the metallic features;
    determining relative positions of the different layers based on the detected one or more resonances;
    determining one or more semiconductor device manufacturing process parameters based on the relative positions of the different layers; and
    determining the adjustment for the semiconductor device manufacturing apparatus based on the one or more determined semiconductor device manufacturing process parameters.
2. The method of clause 1, wherein the radiation comprises light.
3. The method of clauses 1 or 2, wherein determining the relative positions of the different layers comprises determining overlay as part of a semiconductor device manufacturing process.
4. The method of any of clauses 1 to 3, wherein the one or more determined semiconductor device manufacturing process parameters comprise one or more of a mask design, a metrology target design, a semiconductor device design, an intensity of the radiation, an incident angle of the radiation, a wavelength of the radiation, a pupil size and/or shape, or a resist material.
5. The method of any of clauses 1 to 4, further comprising adjusting the semiconductor device manufacturing apparatus based on the determined adjustment.
6. A method for determining relative positions of different layers in a structure, the method comprising:
    irradiating a target portion of the structure with radiation, the target portion comprising metallic features in the different layers of the structure;
    detecting one or more resonances in reflected radiation from the metallic features; and determining the relative positions of the different layers based on the detected one or more resonances.
7. The method of clause 6, wherein the radiation comprises light.
8. The method of clauses 6 or 7, wherein determining the relative positions of the different layers comprises determining a relative shift between the different layers.
9. The method of any of clauses 6 to 8, wherein determining the relative positions of the different layers comprises determining overlay associated with the different layers.
10. The method of any of clauses 6 to 9, further comprising determining whether the metallic features in the different layers are in contact with each other based on the detected one or more resonances.
11. The method of clause 10, wherein the metallic features in the different layers comprise different metals and/or have different dimensions, which cause at least two different resonances in the reflected radiation to be detected.
12. The method of clause 11, wherein the metallic features in the different layers are determined to be in contact or out of contact with each other based on a distance between the at least two different resonances.
13. The method of clause 12, wherein a distance between the at least two different resonances corresponds to an amount the different layers are shifted relative to each other.
14. The method of clause 10, wherein the metallic features in the different layers are formed from the same metal and have the same dimensions, and are determined to be in contact with each other responsive to detection of a single resonance associated with the metallic features.
15. The method of clause 10 or 14, wherein the metallic features in the different layers are formed from the same metal and have the same dimensions, and are determined to be out of contact with each other responsive to detection of two or more resonances associated with the metallic features.
16. The method of clause 15, wherein a distance between resonances corresponds to an amount the different layers are shifted relative to each other.

17. The method of any of clauses 6 to 16, wherein the different layers comprise two layers, each layer having at least one metallic feature.

18. The method of any of clauses 6 to 17, wherein the metallic features comprise different portions of a via that extends through the different layers.

19. The method of any of clauses 6 to 18, wherein the one or more resonances comprise plasmon resonances.

20. The method of any of clauses 6 to 19, wherein an individual resonance comprises a maximum in a wavelength spectrum of the reflected radiation.

21. The method of clause 6, wherein the metallic features in the different layers of the structure are arranged in an array, the array having a pitch; and wherein detecting the one or more resonances in the reflected radiation from the metallic features comprises detecting a resonance associated with the pitch.

22. The method of clause 21, wherein the resonance associated with the pitch is a Fano resonance.

23. The method of clause 21 or 22, wherein the resonance associated with the pitch has a resonance shape, and wherein the relative positions of the different layers are determined based on the resonance shape.

24. The method of any of clauses 21 to 23, wherein determining the relative positions of the different layers comprises determining overlay associated with the different layers based on the resonance associated with the pitch.

25. The method of any of clauses 21 to 24, further comprising adjusting the pitch of the array based on the resonance associated with the pitch.

26. The method of any of clauses 6 to 25, wherein the structure comprises at least a portion of a semiconductor device.

27. The method of any of clauses 6 to 26, wherein determining the relative positions of the different layers based on the detected one or more resonances is performed as part of a semiconductor device manufacturing process.

28. The method of clause 27, further comprising adjusting the semiconductor device manufacturing process or a design of a semiconductor device based on the relative positions of the different layers.

29. A computer program product comprising a non-transitory computer readable medium having instructions recorded thereon, the instructions when executed by a computer implementing the method of any of clauses 1 to 28.

30. A system configured to determine relative positions of different layers in a structure, the system comprising:
a radiation source configured to irradiate a target portion of the structure with radiation, the target portion comprising metallic features in the different layers of the structure;
one or more sensors configured to detect one or more resonances in reflected radiation from the metallic features; and
one or more processors configured to determine the relative positions of the different layers based on the detected one or more resonances.

31. The system of clause 30, wherein the radiation comprises light.

32. The system of clause 30 or 31, wherein determining the relative positions of the different layers comprises determining a relative shift between the different layers.

33. The system of any of clauses 30 to 32, wherein determining the relative positions of the different layers comprises determining overlay associated with the different layers.

34. The system of any of clauses 30 to 33, wherein the one or more processors are further configured to determine whether the metallic features in the different layers are in contact with each other based on the detected one or more resonances.

35. The system of clause 34, wherein the metallic features in the different layers comprise different metals and/or have different dimensions, which cause at least two different resonances in the reflected radiation to be detected by the one or more sensors.

36. The system of clause 35, wherein the metallic features in the different layers are determined, by the one or more processors, to be in contact or out of contact with each other based on a distance between the at least two different resonances.

37. The system of clause 36, wherein the one or more processors are configured such that a distance between the at least two different resonances corresponds to an amount the different layers are shifted relative to each other.

38. The system of clause 34, wherein the metallic features in the different layers are formed from the same metal and have the same dimensions, and the one or more processors are configured such that the metallic features in the different layers are determined to be in contact with each other responsive to detection of a single resonance associated with the metallic features.

39. The system of clause 34 or 38, wherein the metallic features in the different layers are formed from the same metal and the same dimensions, and the one or more processors are configured such that the metallic features in the different layers are determined to be out of contact with each other responsive to detection of two or more resonances associated with the metallic features.

40. The system of clause 39, wherein a distance between resonances corresponds to an amount the different layers are shifted relative to each other.

41. The system of any of clauses 30 to 40, wherein the different layers comprise two layers, each layer having at least one metallic feature.

42. The system of any of clauses 30 to 41, wherein the metallic features comprise different portions of a via that extends through the different layers.

43. The system of any of clauses 30 to 42, wherein the one or more resonances comprise plasmon resonances.

44. The system of any of clauses 30 to 43, wherein an individual resonance comprises a maximum in a wavelength spectrum of the reflected radiation.

45. The system of clause 30, wherein the metallic features in the different layers of the structure are arranged in an array, the array having a pitch; and wherein detecting the one or more resonances in the reflected radiation from the metallic features comprises detecting a resonance associated with the pitch with the one or more sensors.

46. The system of clause 45, wherein the resonance associated with the pitch is a Fano resonance.

47. The system of clause 45 or 46, wherein the resonance associated with the pitch has a resonance shape, and wherein the relative positions of the different layers are determined, by the one or more processors, based on the resonance shape.

48. The system of any of clauses 45 to 47, wherein the one or more processors are configured such that determining the relative positions of the different layers comprises determining overlay associated with the different layers based on the resonance associated with the pitch.

49. The system of any of clauses 45 to 48, wherein the one or more processors are further configured to facilitate adjusting the pitch of the array based on the resonance associated with the pitch.

50. The system of any of clauses 30 to 49, wherein the structure comprises at least a portion of a semiconductor device.

51. The system of any of clauses 30 to 50, wherein the one or more processors are configured such that determining the relative positions of the different layers based on the detected one or more resonances is performed as part of a semiconductor device manufacturing process.

52. The system of clause 51, wherein the one or more processors are further configured to facilitate adjustment of the semiconductor device manufacturing process or a design of a semiconductor device based on the relative positions of the different layers.

53. A system configured to determine whether metallic features in different layers in a structure are in electrical contact with each other, the system comprising: a radiation source configured to irradiate a target portion of the structure with radiation, the target portion comprising a first metallic feature in a first layer and a second metallic feature in a second layer of the structure; one or more sensors configured to detect one or more resonances in reflected radiation from the first and second metallic features; and one or more processors operatively coupled to the radiation source and the one or more sensors, the one or more processors configured to determine whether the first metallic feature in the first layer is in electrical contact with the second metallic feature in the second layer based on (i) a number of detected resonances or (ii) spectral positions of the one or more resonances.

54. The system of clause 53, wherein: (1) the first and second metallic features in the first and second layers comprise different metals and/or have different dimensions, which cause one or more resonances in the reflected radiation to be detected by the one or more sensors, and the first and second metallic features in the first and second layers are determined, by the one or more processors, to be in electrical contact or out of electrical contact with each other based on the spectral positions of the one or more resonances; or (2) the first and second metallic features in the first and second layers are formed from the same metal and have the same dimensions, and the one or more processors are configured such that the first and second metallic features in the first and second layers are determined to be in electrical contact with each other responsive to detection of a single resonance associated with the first and second metallic features and out of electrical contact with each other responsive to detection of two or more resonances associated with the first and second metallic features.

55. The system of clauses 53 or 54, wherein the one or more resonances comprise plasmon resonances.

56. The system of any of the clauses 53 to 55, wherein the one or more resonances comprise predominantly dipolar surface plasmon polariton resonances in the reflected radiation.

57. The system of any of the clauses 53 to 56, wherein the one or more sensors comprise one or more spectrometer detectors configured to detect intensity as a function of wavelength of the reflected radiation.

58. The system of any of the clauses 53 to 57, wherein the one or more sensors are configured as a normal-incidence inspection apparatus where the one or more sensors are oriented at an angle normal to the target portion, or as an oblique-incidence inspection apparatus where the one or more sensors are oriented at a non-normal angle to the target portion.

59. The system of any of the clauses 53 to 58, wherein the radiation source is configured such that the radiation comprises broadband white light collimated with a lens system and transmitted through an interference filter and a polarizer.

60. The system of any of the clauses 53 to 59, wherein the first and second metallic features comprise different portions of a via that extends through the first and second layers.

61. The system of any of the clauses 53 to 60, wherein an individual resonance comprises a maximum in a wavelength spectrum of the reflected radiation.

62. The system of any of the clauses 53 to 61, wherein the first and second metallic features in the first and second layers of the structure are arranged in an array, the array having a pitch; and wherein detecting the one or more resonances in the reflected radiation from the first and second metallic features comprises detecting a resonance associated with the pitch with the one or more sensors.

63. The system of clause 62, wherein the resonance associated with the pitch is a Fano resonance.

64. The system of clause 62, wherein the resonance associated with the pitch has a resonance shape, and wherein the determination of whether the first and second metallic features are in electrical contact is based on the resonance shape.

65. The system of clause 62, wherein the one or more processors are further configured to facilitate adjusting the pitch of the array based on the resonance associated with the pitch.

66. The system of any of the clauses 53 to 65, wherein the one or more processors are further configured to determine one or more of overlay, a manufacturing process failure rate, a critical dimension, or a critical dimension variance associated with the target portion of the structure based on the detected one or more resonances.

67. A method for determining whether metallic features in different layers in a structure are in electrical contact with each other, the method comprising: irradiating, with a radiation source, a target portion of the structure with radiation, the target portion comprising a first metallic feature in a first layer and a second metallic feature in a second layer of the structure; detecting, with one or more sensors, one or more resonances in reflected radiation from the first and second metallic features; and determining, with one or more processors, whether the first and second metallic features in the first and second layers are in electrical contact with each other based on the detected one or more resonances, wherein: (1) the first and second metallic features in the first and second layers comprise different metals and/or have different dimensions, which cause at least two different resonances in the reflected radiation to be detected by the one or more sensors, and the first and second metallic features in the first and second layers are determined, by the one or more processors, to be in electrical contact or out of electrical contact with each other based on a distance between the at least two different resonances; or (2) the first and second metallic features in the first and second layers are formed from the same metal and have the same dimensions, and the one or more processors are configured such that the first and second metallic features in the different layers are determined to be in electrical contact with each other responsive to detection of a single resonance associated with the first and second metallic features and out of electrical contact with each other responsive to detection of two or more resonances associated with the first and second metallic features.

68. A method for determining an adjustment for a semiconductor device manufacturing apparatus, the method comprising: irradiating a target portion of a semiconductor device with radiation, the target portion comprising a first metallic feature in a first layer and a second metallic feature in a second layer of the semiconductor device; detecting one or more resonances in reflected radiation from the first and second metallic features; determining relative positions of the different layers based on the detected one or more resonances; determining whether the first and second metallic features in the first and second layers are in electrical contact with each other based on the detected one or more resonances, wherein: (1) the first and second metallic features in the first and second layers comprise different metals and/or have different dimensions, which cause one or more resonances in the reflected radiation to be detected by the one or more sensors, and the first and second metallic features in the first and second layers are determined, by the one or more processors, to be in electrical contact or out of electrical contact with each other based on the spectral positions of the one or more resonances; or (2) the first and second metallic features in the first and second layers are formed from the same metal and have the same dimensions, and the first and second metallic features in the first and second layers are determined to be in electrical contact with each other responsive to detection of a single resonance associated with the first and second metallic features and out of electrical contact with each other responsive to detection of two or more resonances associated with the first and second metallic features; determining one or more semiconductor device manufacturing process parameters based on the relative positions of the different layers and/or the determination of whether the first and second metallic features are in electrical contact with each other; and determining the adjustment for the semiconductor device manufacturing apparatus based on the one or more determined semiconductor device manufacturing process parameters.

69. A computer program product comprising a non-transitory computer readable medium having instructions recorded thereon, the instructions when executed by a computer implementing the method of any of clauses 67 or 68.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers. In addition, the combination and sub-combinations of disclosed elements may comprise separate embodiments. For example, system 10 shown in FIGS. 4 and 5 may be used to perform some or all of the operations of method 700 shown in FIG. 7, and/or system 10 may be used separately from the method 700 embodiment.

The descriptions above are intended to be illustrative, not limiting. Thus, it will be apparent to one skilled in the art that modifications may be made as described without departing from the scope of the claims set out below.

What is claimed is:

1. A system comprising:
   a radiation output configured to irradiate a target portion of a structure with radiation, the target portion comprising a first metallic feature in a first layer and a second metallic feature in a second layer of the structure;
   one or more sensors configured to detect one or more resonances in reflected radiation from the first and second metallic features; and
   one or more processors configured to determine whether the first metallic feature in the first layer is in electrical contact with the second metallic feature in the second layer based on (i) a number of detected resonances or (ii) spectral positions of detected resonances.

2. The system of claim 1, wherein (1) the first and second metallic features in the first and second layers comprise different metals and/or have different dimensions, which cause one or more resonances in the reflected radiation to be detected by the one or more sensors, and the first and second metallic features in the first and second layers are determined, by the one or more processors, to be in electrical contact or out of electrical contact with each other based on the spectral positions of the one or more resonances; or (2) the first and second metallic features in the first and second layers are formed from the same metal and have the same dimensions, and the one or more processors are configured such that the first and second metallic features in the first and second layers are determined to be in electrical contact with each other responsive to detection of a single resonance associated with the first and second metallic features and out of electrical contact with each other responsive to detection of two or more resonances associated with the first and second metallic features.

3. The system of claim 1, comprising a radiation source configured such that the radiation comprises broadband white light collimated with a lens system and transmitted through an interference filter and a polarizer.

4. The system of claim 1, wherein the first and second metallic features comprise different portions of a via that extends through the first and second layers.

5. The system of claim 1, wherein an individual resonance comprises a maximum in a wavelength spectrum of the reflected radiation.

6. The system of claim 1, wherein the one or more processors are further configured to determine one or more selecting from: overlay, a manufacturing process failure rate, a critical dimension, or a critical dimension variance, associated with the target portion of the structure based on the detected one or more resonances.

7. The system of claim 1, wherein the one or more resonances comprise plasmon resonances.

8. The system of claim 7, wherein the one or more resonances comprise predominantly dipolar surface plasmon polariton resonances in the reflected radiation.

9. The system of claim 1, wherein the one or more sensors comprise one or more spectrometer detectors configured to detect intensity as a function of wavelength of the reflected radiation.

10. The system of claim 9, wherein the one or more sensors are configured as a normal-incidence inspection apparatus where the one or more sensors are oriented at an angle normal to the target portion, or as an oblique-incidence inspection apparatus where the one or more sensors are oriented at a non-normal angle to the target portion.

11. The system of claim 1, wherein the first and second metallic features in the first and second layers of the structure are arranged in an array, the array having a pitch; and wherein the detection of the one or more resonances in the reflected radiation from the first and second metallic features comprises detection, with the one or more sensors, of a resonance associated with the pitch.

12. The system of claim 11, wherein the resonance associated with the pitch is a Fano resonance.

13. The system of claim 11, wherein the resonance associated with the pitch has a resonance shape, and wherein the determination of whether the first and second metallic features are in electrical contact is based on the resonance shape.

14. A method comprising:
irradiating a target portion of a semiconductor device with radiation, the target portion comprising a first metallic feature in a first layer and a second metallic feature in a second layer of the semiconductor device;
detecting one or more resonances in reflected radiation from the first and second metallic features;
determining a relative position of the first and second layers based on the detected one or more resonances and/or whether the first and second metallic features in the first and second layers are in electrical contact with each other based on (i) a number of detected resonances or (ii) spectral positions of detected resonances;
determining one or more semiconductor device manufacturing process parameters based on the determination of the relative positions of the first and second layers and/or determination of whether the first and second metallic features are in electrical contact with each other; and
determining an adjustment for a semiconductor device manufacturing apparatus based on the one or more determined semiconductor device manufacturing process parameters.

15. The method of claim 14, comprising determining whether the first and second metallic features in the first and second layers are in electrical contact with each other and wherein:
(1) the first and second metallic features in the first and second layers comprise different metals and/or have different dimensions, which cause the one or more resonances in the reflected radiation, and the first and second metallic features in the first and second layers are determined to be in electrical contact or out of electrical contact with each other based on the spectral positions of the one or more resonances; or
(2) the first and second metallic features in the first and second layers are formed from the same metal and have the same dimensions, and the first and second metallic features in the first and second layers are determined to be in electrical contact with each other responsive to detection of a single resonance associated with the first and second metallic features and out of electrical contact with each other responsive to detection of two or more resonances associated with the first and second metallic features.

16. A computer program product comprising a non-transitory computer-readable medium having instructions therein, the instructions, when executed by a computer system, configured to cause the computer system to at least:
obtain one or more resonances detected in reflected radiation from first and second metallic features on a semiconductor device substrate; and
determine a relative position of the first and second metallic features based on the detected one or more resonances and/or whether the first and second metallic features are in electrical contact with each other based on (i) a number of detected resonances or (ii) spectral positions of detected resonances.

17. A computer program product comprising a non-transitory computer-readable medium having instructions therein, the instructions, when executed by a computer system, configured to cause the computer system to at least:
obtain detected one or more resonances in reflected radiation from a target portion of a structure, the target portion comprising a first metallic feature in a first layer and a second metallic feature in a second layer of the structure; and
determine a relative position of the first and second layers based on the detected one or more resonances and/or whether the first and second metallic features in the first and second layers are in electrical contact with each other based on (i) a number of detected resonances or (ii) spectral positions of detected resonances.

18. The computer program product of claim 17, wherein the instructions are further configured to determine an adjustment for a semiconductor device manufacturing process or apparatus based on the determined relative position and/or on whether the first and second metallic features in the first and second layers are in electrical contact with each other.

19. The computer program product of claim 17, wherein the instructions are configured to determine whether the first and second metallic features in the first and second layers are in electrical contact with each other and wherein:
(1) the first and second metallic features in the first and second layers comprise different metals and/or have different dimensions, which cause the one or more resonances in the reflected radiation, and the first and second metallic features in the first and second layers are determined to be in electrical contact or out of electrical contact with each other based on the spectral positions of the one or more resonances; or
(2) the first and second metallic features in the first and second layers are formed from the same metal and have the same dimensions, and the first and second metallic features in the first and second layers are determined to be in electrical contact with each other responsive to detection of a single resonance associated with the first and second metallic features and out of electrical contact with each other responsive to detection of two or more resonances associated with the first and second metallic features.

20. The computer program product of claim 17, wherein the first and second metallic features comprise different portions of a via that extends through the first and second layers.

* * * * *